US010008249B2

(12) United States Patent
Antonyan

(10) Patent No.: US 10,008,249 B2
(45) Date of Patent: Jun. 26, 2018

(54) SEMICONDUCTOR MEMORY DEVICE WITH INCREASED OPERATING SPEED

(71) Applicant: SAMSUNG ELECTRONICS CO., LTD., Suwon-si, Gyeonggi-Do (KR)

(72) Inventor: Artur Antonyan, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/405,336

(22) Filed: Jan. 13, 2017

(65) Prior Publication Data

US 2017/0278556 A1 Sep. 28, 2017

(30) Foreign Application Priority Data

Mar. 23, 2016 (KR) .................. 10-2016-0034729

(51) Int. Cl.
*G11C 11/00* (2006.01)
*G11C 11/16* (2006.01)

(52) U.S. Cl.
CPC ...... *G11C 11/1655* (2013.01); *G11C 11/1653* (2013.01); *G11C 11/1657* (2013.01); *G11C 11/1673* (2013.01); *G11C 11/1675* (2013.01); *G11C 11/1693* (2013.01)

(58) Field of Classification Search
CPC ............ G11C 11/1655; G11C 11/1657; G11C 11/1673; G11C 11/1675; G11C 11/1693
USPC ............ 365/185.11, 185.18, 185.19, 185.23, 365/185.25, 51, 63, 158, 163, 171, 365/189.011, 189.15, 189.16, 189.14, 365/230.01, 230.06, 233.16, 233.17, 365/233.19
See application file for complete search history.

(56) References Cited

U.S. PATENT DOCUMENTS

| 7,881,147 | B2 | 2/2011 | Chen et al. | |
|---|---|---|---|---|
| 8,004,880 | B2 | 8/2011 | Yoon et al. | |
| 8,320,167 | B2 | 11/2012 | Rao et al. | |
| 8,917,546 | B2 | 12/2014 | Abedifard | |
| 9,007,819 | B2 | 4/2015 | Ahn et al. | |
| 2008/0122678 | A1 | 5/2008 | Mei | |
| 2008/0316798 | A1 | 12/2008 | Tanizaki et al. | |
| 2009/0103354 | A1 | 4/2009 | Yoon et al. | |
| 2012/0069638 | A1 | 3/2012 | Matsuda et al. | |
| 2012/0075926 | A1* | 3/2012 | Hanzawa ........... | G11C 13/0004 365/163 |
| 2013/0028010 | A1 | 1/2013 | Li et al. | |
| 2013/0051163 | A1* | 2/2013 | Koike ................. | G11C 29/023 365/189.15 |
| 2013/0155763 | A1 | 6/2013 | Alam et al. | |
| 2014/0063923 | A1 | 3/2014 | Jefremow et al. | |
| 2015/0022264 | A1* | 1/2015 | Kim ................... | G01R 31/2851 330/2 |

(Continued)

*Primary Examiner* — Fernando Hidalgo
(74) *Attorney, Agent, or Firm* — Volentine, Whitt & Francos, PLLC

(57) ABSTRACT

A semiconductor memory device includes a memory cell array comprising a plurality of spin torque transfer-magnetic random access memory (STT-MRAM) cells connected to a plurality of word lines, a plurality of bit lines and a plurality of sense lines. A peripheral circuitry supplies cell current to the memory cells during read/write operations, such that the cell current supplied to memory cells of a selected word line vary according to a position of a word line group including the selected word line.

20 Claims, 20 Drawing Sheets

(56) References Cited

U.S. PATENT DOCUMENTS

2015/0206570 A1 7/2015 Alam et al.
2015/0213866 A1 7/2015 Wu et al.

* cited by examiner

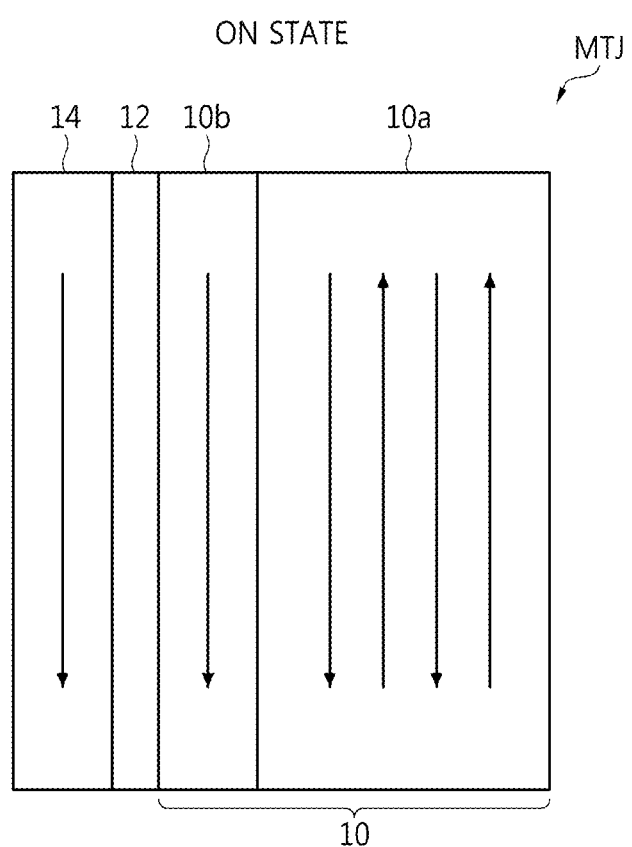

| WL Group | TFR/TFW |
|---|---|
| G1 | TD1+3*TD2 |
| G2 | TD1+2*TD2 |
| G3 | TD1+1*TD2 |
| G4 | TD1 |

Where TD2 = Rp*Cp

SEMICONDUCTOR MEMORY DEVICE WITH INCREASED OPERATING SPEED

CROSS-REFERENCE TO RELATED APPLICATIONS

This application claims priority under 35 U.S.C. § 119(a) from Korean Patent Application No. 10-2016-0034729 filed on Mar. 23, 2016, the disclosure of which is hereby incorporated by reference in its entirety.

BACKGROUND

Embodiments of the inventive concept relate to a semiconductor memory device, and more particularly, to a semiconductor memory device including spin-transfer torque magnetic random access memory (STT-MRAM).

Semiconductor memory devices may be classified as volatile and non-volatile according to their operative nature. MRAM is one type of non-volatile semiconductor memory device including a resistive element that may be programmed to a desired data state, corresponding to a selected resistive state, where such data state is stably retained in the absence of applied power. SST-MRAM has been referred to as universal memory because it combines the low cost and high data capacity features associated with a dynamic random access memory (DRAM) with the fast operating speed associated with a static random access memory (SRAM).

Magnetic memory, and more specifically, MRAM has received a lot of attention due to its fast read/write speed, high durability, non-volatile operating nature, and low power consumption during operation. MRAM stores information using a magnetic material as a data storage medium. STT-MRAM is a type of MRAM. A magnetic tunnel junction (MTJ) can be used in typical STT-MRAM.

SUMMARY

According to some embodiments of the inventive concept, there is provided a semiconductor memory device including; a memory cell array comprising a plurality of memory cells, wherein each memory cell is connected to a word line among a plurality of word lines grouped into a plurality of word line groups, a bit line among a plurality of bit lines, and a sense lines among a plurality of sense lines, and a peripheral circuit configured to supply cell current to the plurality of memory cells during a read operation or a write operation, wherein the peripheral circuit varies the cell current supplied to memory cells connected to a selected word line according to a position of a word line group including the selected word line.

According to some embodiments of the inventive concept, there is provided a semiconductor memory device including; a memory cell array comprising a plurality of memory cells connected to a plurality of word lines arranged in a first direction, a plurality of bit lines arranged in a second direction, and a plurality of sense lines arranged in the second direction, a control logic configured to generate control signals including a write driving signal and a read driving signal, and a write driver and sense amplifier block configured to generate a cell current that varies in response to the control signals and is selectively applied to the plurality of memory cells.

According to some embodiments of the inventive concept, there is provided a semiconductor memory device including; a memory cell array comprising a plurality of memory cells, wherein each memory cell is a spin torque transfer-magnetic random access memory (STT-MRAM) cell connected to a word line among a plurality of word lines, and connected between a bit line among a plurality of bit lines and a sense line among a plurality of sense lines, wherein the memory cell array is divided into a first memory cell array and a second memory cell array, and peripheral circuitry configured to supply cell current to the plurality of memory cells during a read operation or a write operation, such that the cell current supplied to memory cells connected to a selected word line vary according to a position of a word line group including the selected word line, wherein at least a portion of the peripheral circuitry is disposed between the first memory cell array and second memory cell array.

BRIEF DESCRIPTION OF THE DRAWINGS

The above and other features and advantages of the inventive concept will become more apparent upon consideration of certain exemplary embodiments thereof with reference to the attached drawings in which:

FIGS. 8 and 9 are block diagrams of a magnetic tunnel junction (MTJ) structure according to some embodiments of the inventive concept;

DETAILED DESCRIPTION

Figure 1:
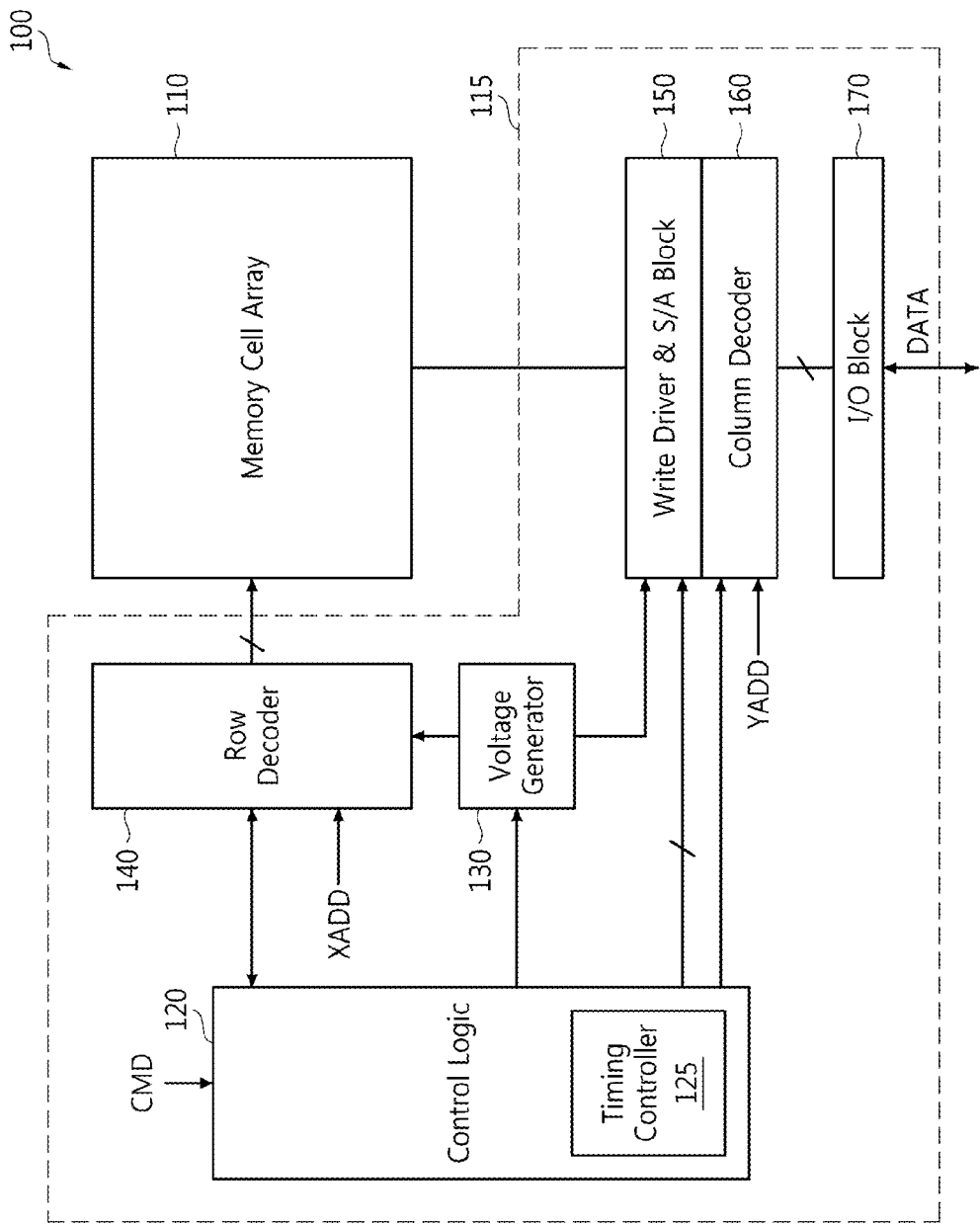
FIG. 1 is a block diagram of a semiconductor memory device according to some embodiments of the inventive concept.

FIG. 1 is a block diagram of a semiconductor memory device 100 according to some embodiments of the inventive concept. The semiconductor memory device 100 may generally include a memory cell array 110 and a peripheral circuit 115. The semiconductor memory device 100 may be implemented as a volatile memory device and/or a non-volatile memory device. The volatile memory device may include dynamic random access memory (DRAM), static RAM (SRAM), thyristor RAM (T-RAM), zero capacitor RAM (Z-RAM), or twin transistor RAM (TTRAM). The non-volatile memory device may include electrically erasable programmable read-only memory (EEPROM), flash memory, magnetic RAM (MRAM), spin-transfer torque MRAM (STT-MRAM), conductive bridging RAM (CBRAM), ferroelectric RAM (FeRAM), phase-change RAM (PRAM), resistive RAM (RRAM), nanotube RRAM, polymer RAM (PoRAM), nano-floating gate memory (NFGM), holographic memory, molecular electronics memory device, or insulator resistance change memory. In the description that follows, it is assumed that the semiconductor memory device 100 includes STT-MRAM.

The memory cell array 110 includes a plurality of memory cells, where each memory cell is respectively configured to store data. The memory cell array 110 may be implemented in a two dimensional or a three dimensional configuration. A three-dimensional memory cell array may be monolithically formed at one or more physical levels in an array of memory cells having an active region disposed on (or above) a silicon substrate and may include a circuit involved in the operation of the memory cells. The circuit may be formed in, on or above the silicon substrate. The term "monolithic" means that layers at each level in an array are directly deposited on layers at an underlying level in the array. The three-dimensional memory cell array may include a vertical string which is vertically oriented so that at least one memory cell is placed on or above another memory cell. The at least one memory cell may include a charge trap layer.

The peripheral circuit 115 may be used to access the memory cell array 110 according to various data access operations, such as a read operation or a write operation, according to a command set (CMD, XADD, YADD) provided by an external device (e.g., a memory controller, not shown). In the illustrated example of FIG. 1, the peripheral circuit 115 comprises control logic 120, a voltage generator 130, a row decoder 140, a write driver and sense amplifier (S/A) block 150, a column decoder 160, and an input/output (I/O) block 170.

The control logic 120 may be used to control the overall operation of the peripheral circuit 115 in response to one or more command(s) CMD included in the command set. For example, the control logic 120 may output a plurality of control signals (e.g., WRF, WR1, WR2, PRE, RDF, and RD) that collectively define a data access operation performed by the peripheral circuit 115. Here, the control signals are assumed to include a write driving signal WRF, a first write control signal WR1, a second write control signal WR2, a precharge control signal PRE, a read driving signal RDF, and a read control signal RD. The control logic 120 may include a timing controller 125 which controls the output timing of the control signals WRF, WR1, WR2, PRE, RDF, and RD. Certain examples of this approach will be described in some additional detail hereafter with reference to FIGS. 8 and 9.

The voltage generator 130 may be used to generate a plurality of operating voltages (e.g., WRV1, WRV2, RDV, and VRB) associated with the data access operation according to a control code generated by the control logic 120. Here, the operating voltages are assumed to include a first write operating voltage WRV1, a second write operating voltage WRV2, a read operating voltage RDV, and a reference voltage VRB. In the illustrated example of FIG. 1, operating voltage(s) generated by voltage generator 130 are applied to the memory cell array 110 through the row decoder 140. However, other approaches to the provision of operating voltages may alternately or additionally provided. The voltage generator 130 may enable the first write operating voltage WRV1 during a first write operation, enable the second write operating voltage WRV2 during a second write operation, and enable the read operating voltage RDV during a read operation in some embodiments, but the inventive concept is not restricted to these embodiments.

The row decoder 140 may be used to decode a row address XADD under the control of the control logic 120 (e.g., in response to a control signal provided by the control logic 120). A row driver (not shown) may activate a word line corresponding to a decoded row address XADD. Although the row driver is not shown in FIG. 1, the row decoder 140 may include the row driver. However, the inventive concept is not restricted to this particular implementation.

The column decoder 160 may be used to decode a column address YADD under the control of the control logic 120 (e.g., in response to a control signal provided by the control logic 120).

The write driver and S/A block 150 may function as an S/A that senses and/or amplifies a voltage level of each of column lines included in the memory cell array 110 under the control of the control logic 120 during a read operation performed by the semiconductor memory device 100. One example of this operation and corresponding functionality will be described hereafter in some additional detail with reference to FIG. 6. The write driver and S/A block 150 may function as a write driver that drives each of the column lines included in the memory cell array 110 under the control of the control logic 120 during a write operation performed by the semiconductor memory device 100. One example of this operation and corresponding functionality will be described hereafter in some additional detail with reference to FIG. 4.

The I/O block 170 may be used to receive "write data" (i.e., data to be written or programmed to the memory cell array 110) provided by an external device and then communicate the write data to the column decoder 160. The I/O block 170 may also be used to receive "read data" (i.e., data retrieved from the memory cell array 110) from the column decoder 160, and then communicate the read data to an external device (e.g., a memory controller).

Figure 2:
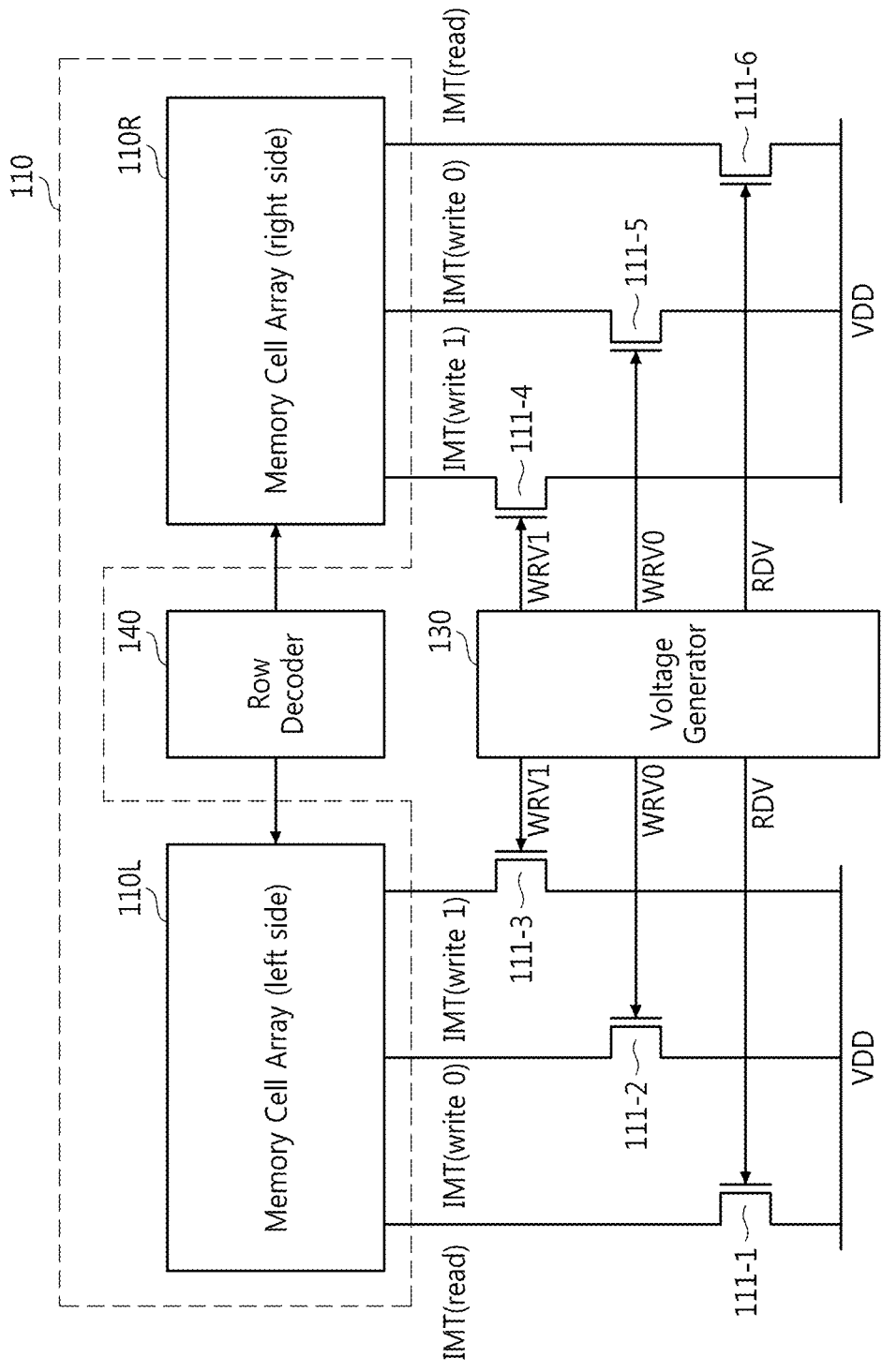
FIG. 2 is a block diagram of a semiconductor memory device according to other embodiments of the inventive concept.

FIG. 2 is a block diagram of the semiconductor memory device 100 according to other embodiments of the inventive concept. For the sake of description and illustrative clarity, only the memory cell array 110, voltage generator 130 and row decoder 140 of FIG. 1 are included in FIG. 2. Referring to FIG. 2, the memory cell array 110 is physically divided into a first (or left side) memory cell array 110L and a second (or right side) memory cell array 110R, where the row decoder 140 is interposed (wholly or partially) between the first and second memory cell arrays 110L and 110R.

Here again, the voltage generator 130 may generate the first write operating voltage WRV1 associated with the first write operation, the second write operating voltage WRV2 associated with the second write operation, and/or the read operating voltage RDV associated with the read operation. For example, the first write operation may be used to write a data value of "1" and the second write operation may be used to write a data value of "0".

When the first write operating voltage WRV1 is applied to a gate of at least one transistor selected from among a plurality of transistors 111-1 through 111-6, a corresponding first cell current (IMT) flows to at least one of the first and second memory cell arrays 110L and 110R. As a result, a data value of "1" may be written to one or more memory cell(s) included in the at least one of the first and second memory cell arrays 110L and 110R.

When the second write operating voltage WRV2 is applied to a gate of at least one transistor selected from among the transistors 111-1 through 111-6, a corresponding second cell current IMT flows to at least one of the first and second memory cell arrays 110L and 110R. As a result, a data value of "0" may be written to one or more of memory cell(s) included in the at least one of the first and second memory cell arrays 110L and 110R.

When the read operating voltage RDV is applied to a gate of at least one transistor selected from among the transistors 111-1 through 111-6, a corresponding read cell current IMT flows to at least one of the first and second memory cell arrays 110L and 110R. Accordingly, read data may be determined by sensing/amplifying the read cell current IMT.

In the illustrated example of FIG. 2, one end of each one of the plurality of transistors 111-1 through 111-6 is connected to a first driving voltage (e.g., VDD) and another end of each one of the plurality of transistors 111-1 through 111-6 is connected to connected to the memory cell array 110.

As illustrated in FIG. 2, the voltage generator 130 and/or row decoder 140 may be placed between the first memory cell array 110L and the second memory cell array 110R in order to prevent or minimize an IR drop of various operating voltage(s) as the size of the memory cell array 110 increases. In this context, the term "between" means a disposition of the voltage generator 130 and/or row decoder 140 such that at least one portion of the memory cell array 110 is on one side and another at least one portion of the memory cell array 110 is on the other (e.g., opposing) side of the voltage generator 130 and/or row decoder 140. In this regard, the first memory cell array 110L and second memory cell array 110R may be symmetrically disposed with respect to the voltage generator 130 and/or row decoder 140, but the inventive concept is not restricted to only this configuration.

Figure 3:
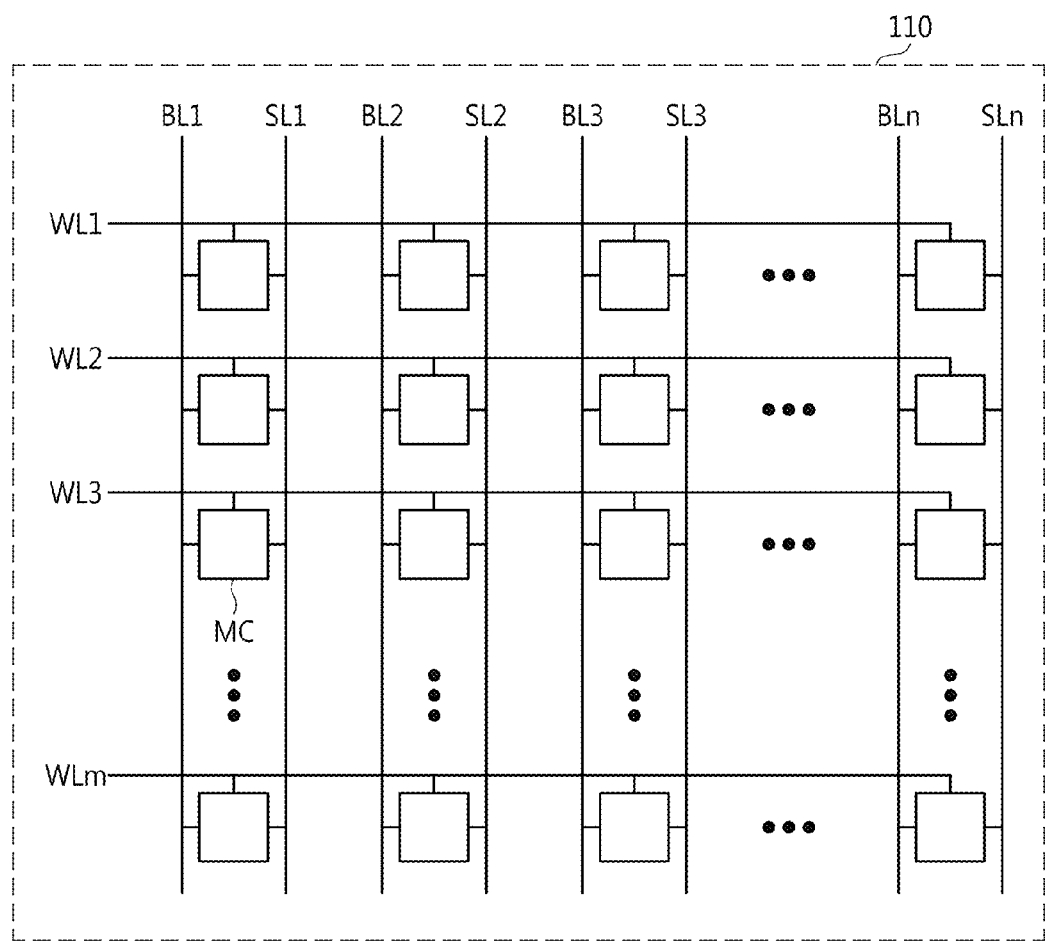
FIG. 3 is a block diagram of a memory cell array according to some embodiments of the inventive concept.

FIG. 3 is a block diagram of the memory cell array 110 according to some embodiments of the inventive concept. Referring to FIG. 3, the memory cell array 110 includes a plurality of word lines WL1 through WLm, where "m" is an integer of at least 4; a plurality of bit lines BL1 through BLn, where "n" is an integer of at least 4; a plurality of source lines SL1 through SLn; and a plurality of memory cells M, where the memory cells MC may be MRAM cells.

The word lines WL1 through WLm may be arranged in a first direction. The bit lines BL1 through BLn and the source lines SL1 through SLn may be arranged in a second direction different from the first direction. The bit lines BL1 through BLn may alternate with the source lines SL1 through SLn. The first direction and the second direction may be perpendicular to each other.

Each of the memory cells MC may be connected to one of the word lines WL1 through WLm, one of the bit lines BL1 through BLn, and one of the source lines SL1 through SLn. One or more of the word lines WL1 through WLm may be selectively activated by the row decoder 140 illustrated in FIG. 1.

Although not shown in FIG. 3, the memory cell array 110 may also include a signal line used to program the memory cells MC and each of the memory cells MC may be connected to the signal line. The memory cell array 110 of FIG. 3 is shown with a separate source line structure, but other embodiments of the inventive concept are not restricted to this configuration. For example, the memory cell array 110 may have a common source line structure in other embodiments.

Figure 4:
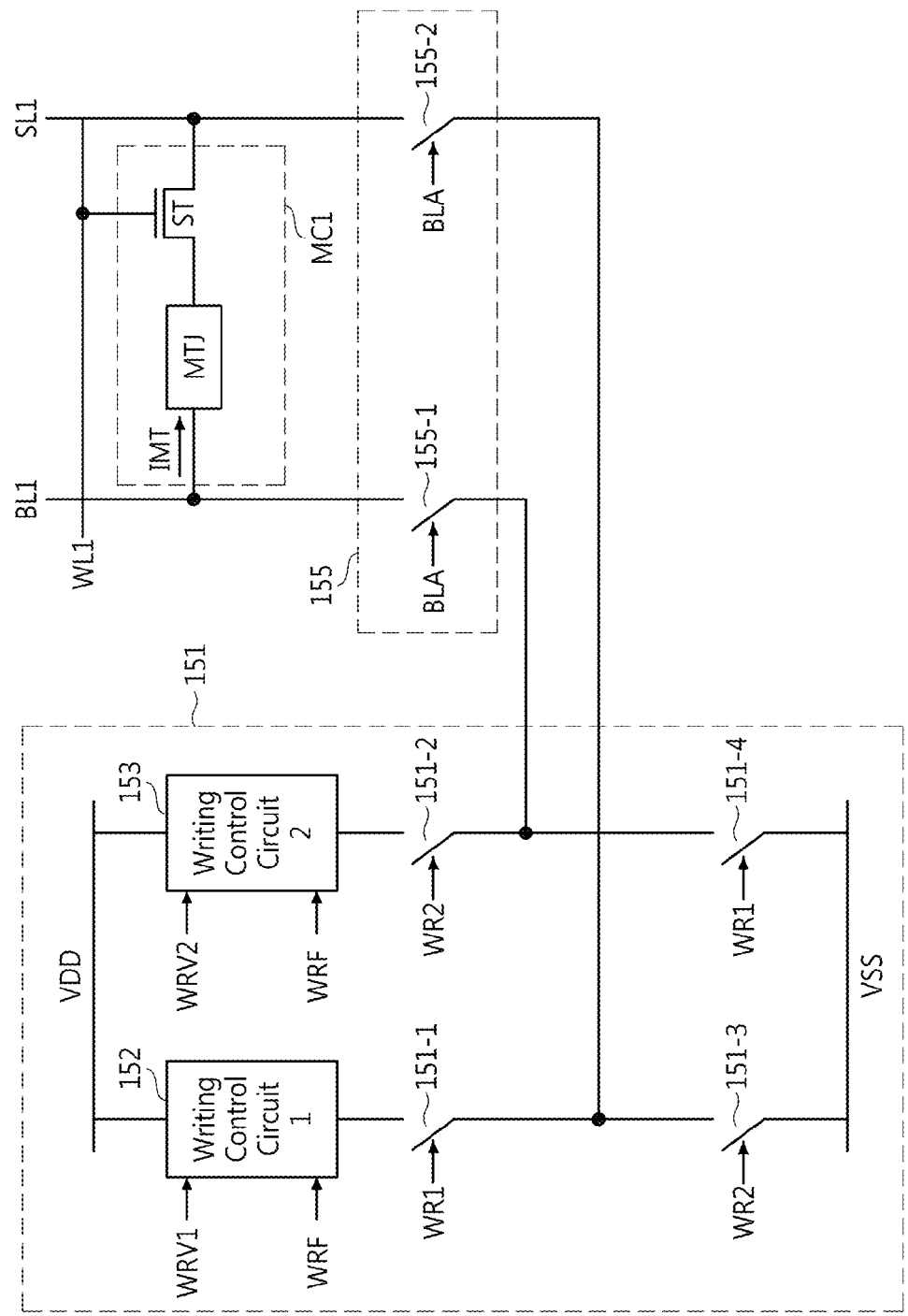
FIG. 4 is a block diagram of a write operation of a semiconductor memory device according to some embodiments of the inventive concept.

FIG. 4 is a block diagram further illustrating one approach to the execution of a write operation in a semiconductor memory device according to an embodiment of the inventive concept. For clarity only a write driver 151, a bit line control circuit 155, and a first memory cell MC1 are illustrated in FIG. 4. Those skilled in the art will understand the operative context of these elements within the various embodiments of the inventive concept such as the illustrated embodiment of FIG. 1. For example, the write driver 151 and bit line control circuit 155 may be included in the write driver and S/A block 150 of FIG. 1. The bit line control circuit 155 may be included in the memory cell array 110 or the write driver and S/A block 150.

The first memory cell MC1 is connected to the first bit line BL1, the first source line SL1, and the first word line WL1. Elements corresponding to the first memory cell MC1 will be described hereafter in some additional detail, but the same operation may be applied to other memory cells MC in the memory cell array 110 of FIGS. 1, 2 and 3.

The first memory cell MC1 may include a magnetic tunnel junction (MTJ) structure and a select transistor ST. When the first word line WL1 is activated, the select transistor ST is also activated, so that the first bit line BL1 is connected with the first source line SL1. At this time, the cell current IMT flowing to the first memory cell MC1 may be generated. Data may be written by the cell current IMT during a write operation. Data may be read by sensing the cell current IMT. However, the scope of the inventive concept is not restricted to only these working assumptions.

The bit line control circuit 155 may include switches 155-1 and 155-2 which control each of the bit lines BL1 through BLn and each of the source lines SL1 through SLn, respectively, according to a bit line control signal BLA. Only the switches 155-1 and 155-2 respectively corresponding to the first bit line BL1 and the first source line SL1 are illustrated in FIG. 4 for convenience of description. The bit line control circuit 155 may be turned ON in response to the bit line control signal BLA received from the column decoder 160 so as to activate the first bit line BL1 and the first source line SL1. It is assumed below that the bit line control circuit 155 is in an ON-state to explain the operation of the first memory cell MC1.

The write driver 151 may be connected to the first memory cell MC1 through the first bit line BL1 and the first source line SL1. The first memory cell MC1 may store data 0 or data 1 according to the control of the write driver 151. The write driver 151 may write data 0 or data 1 to the first memory cell MC1 based on the first and second write operating voltages WRV1 and WRV2 received from the voltage generator 130 illustrated in FIG. 1 and the first and second write control signal WR1 and WR2 and the write driving signal WRF which are received from the control logic 120 illustrated in FIG. 1. The write driver 151 may include a first writing control circuit 152, a second writing control circuit 153, and a plurality of write switches 151-1 through 151-4.

Each of the write switches 151-1 through 151-4 may be controlled according to one of the first and second write control signals WR1 and WR2. For instance, the first write control signal WR1 may enable the writing of data 1 and the second write control signal WR2 may enable the writing of data 0. Each of the write switches 151-1 through 151-4 may be implemented as an N-channel metal oxide semiconductor (NMOS) transistor, a P-channel MOS (PMOS) transistor, or a combination thereof.

When one of the first and second write control signals WR1 and WR2 is enabled, the other may be not enabled (or disabled). Thus, when the second write control signal WR2 is enabled, the first write control signal WR1 is disabled, and the cell current IMT may flow from the first bit line BL1 to the first source line SL1, as shown in FIG. 4. Alternately, when the first write control signal WR1 is enabled, the second write control signal WR2 is disabled, and the cell current IMT may flow from the first source line SL1 to the first bit line BL1. However, this is just one example of write control signal switching.

When the first write control signal WR1 is applied to the write driver 151, a terminal of the first writing control circuit 152 connected to the first driving voltage VDD through another terminal may be connected to the first source line SL1 and a second driving voltage VSS may be connected to the first bit line BL1. At this time, a resistance of the first writing control circuit 152 changes based on the write driving signal WRF, and therefore, the control logic 120 illustrated in FIG. 1 may control the cell current IMT. For instance, the resistance of the first writing control circuit 152 when the write driving signal WRF is enabled may be less than the resistance of the first writing control circuit 152 when the write driving signal WRF is disabled. Analogously, when the second write control signal WR2 is applied to the write driver 151, a terminal of the second writing control circuit 153 connected to the first driving voltage VDD through another terminal may be connected to the first bit line BL1 and the second driving voltage VSS may be connected to the first source line SL1. At this time, a resistance of the second writing control circuit 153 changes based on the write driving signal WRF, and therefore, the control logic 120 illustrated in FIG. 1 may control the cell current IMT. For instance, the resistance of the second writing control circuit 153 when the write driving signal WRF is enabled may be less than the resistance of the second writing control circuit 153 when the write driving signal WRF is disabled. These examples will be described in some additional detail with reference to FIGS. 7, 8, 9 and 10 hereafter.

Figure 5:
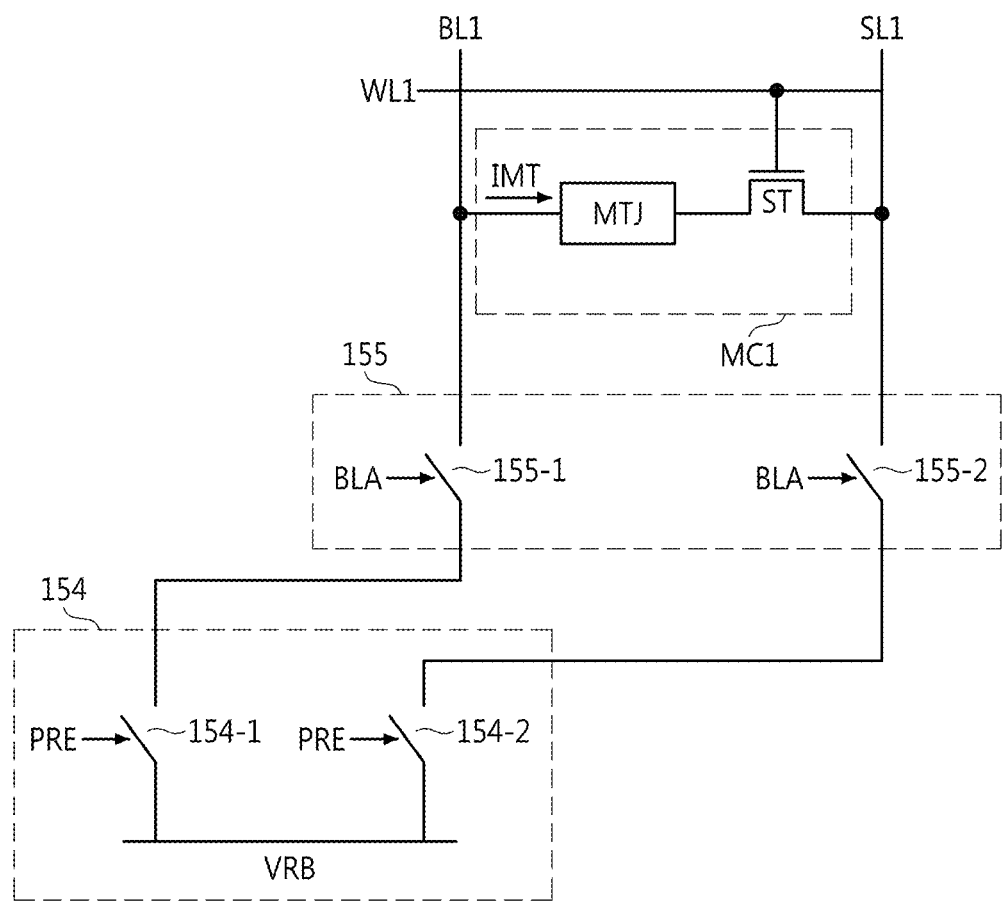
FIG. 5 is a block diagram of a precharge operation of a semiconductor memory device according to some embodiments of the inventive concept.

FIG. 5 is a block diagram further illustrating in one example the execution of a precharge operation by a semiconductor memory device according to an embodiment of the inventive concept. The assumptions previously made in relation to the illustrated embodiment of FIG. 4 are again assumed in relation to the illustrated embodiment of FIG. 5. To describe the precharge operation, a precharge circuit 154, the bit line control circuit 155, and the first memory cell MC1 are illustrated in FIG. 5. The precharge circuit 154 may be included in the memory cell array 110 or the write driver and S/A block 150 of FIG. 1, for example.

The precharge circuit 154 may include switches that respectively precharge the bit lines BL1 through BLn and source lines SL1 through SLn in response to the precharge signal PRE. For convenience of description, only switches 154-1 and 154-2 respectively corresponding to the first bit line BL1 and the first source line SL1 are illustrated in FIG. 5. The precharge circuit 154 is turned ON in response to the precharge signal PRE received from the control logic 120 so as to precharge the first bit line BL1 and the first source line SL1 to the reference voltage VRB.

Figure 6:
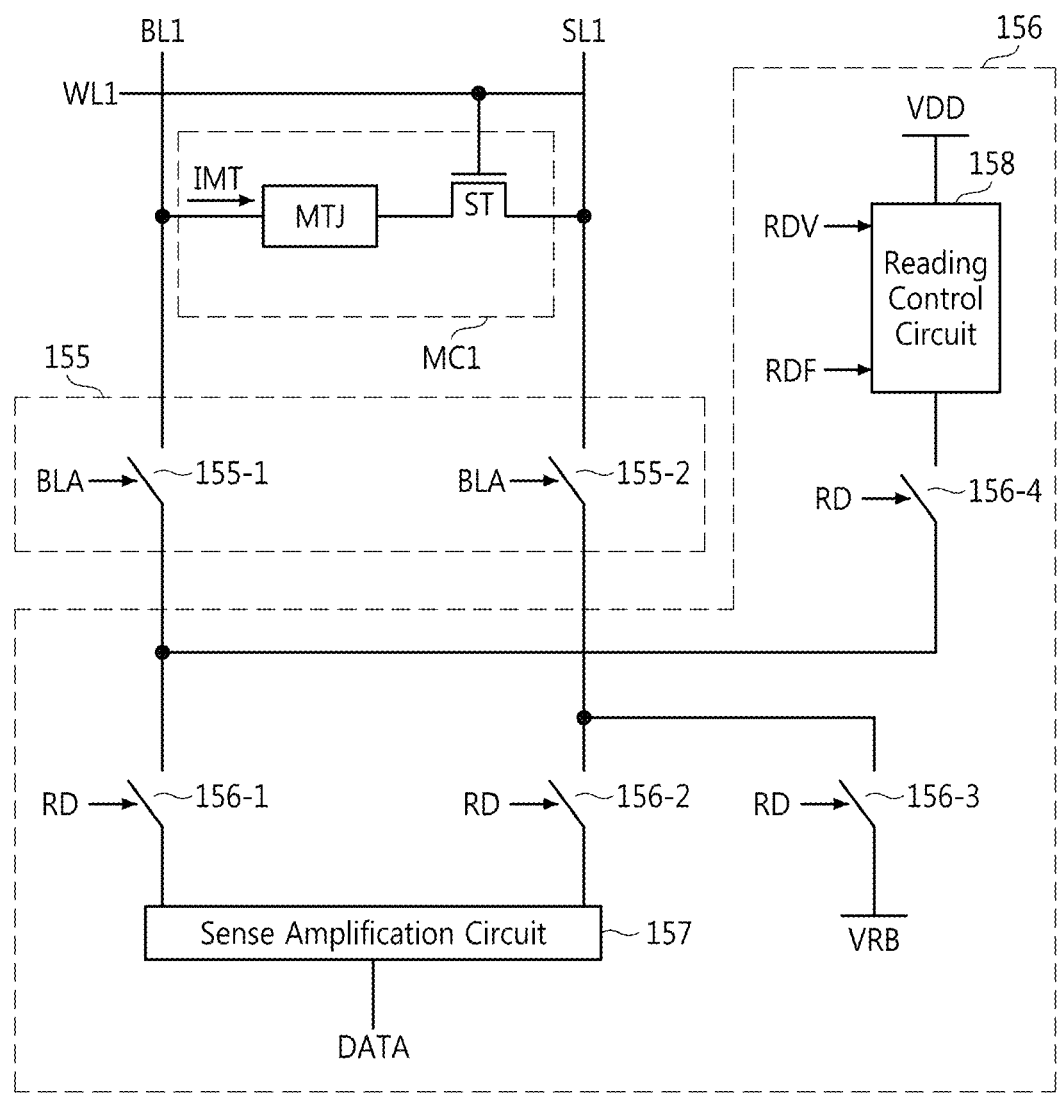
FIG. 6 is a block diagram of a read operation of a semiconductor memory device according to some embodiments of the inventive concept.

FIG. 6 is a block diagram further illustrating the execution of a read operation by a semiconductor memory device according to an embodiment of the inventive concept. The assumptions previously made in relation to the illustrated embodiments of FIGS. 4 and 5 are again assumed in relation to the illustrated embodiment of FIG. 6. To describe the read operation, an S/A 156, the bit line control circuit 155, and the first memory cell MC1 are illustrated in FIG. 6. The bit line control circuit 155 may be included in the memory cell array 110 or the write driver and S/A block 150 of FIG. 1, for example.

The S/A 156 may be connected to the first memory cell MC1 through the first bit line BL1 and the first source line SL1. The S/A 156 may read data from the first memory cell MC1 in response to the read operating voltage RDV received from the voltage generator 130 of FIG. 1, as well as the read control signal RD and read driving signal RDF received from the control logic 120 of FIG. 1. The S/A 156 may include a sense amplification circuit 157, a reading control circuit 158, and a plurality of read switches 156-1 through 156-4. One of the read switches 156-1 through 156-4 may apply the reference voltage VRB to the first source line SL1 according to the read control signal RD.

In this manner, the read switches 156-1 through 156-4 may be controlled according to the read control signal RD, or otherwise stated, the read control signal RD enables the reading of read data from the memory cell array 110. Hence, it is assumed below that the read control signal RD is applied to the S/A 156 during a read operation. Each of the read switches 156-1 through 156-4 may be implemented as an NMOS transistor, a PMOS transistor, or a combination thereof. The sense amplification circuit 157 may sense a current signal flowing in the first bit line BL1 and the first source line SL1 and output data.

When the read control signal RD is applied to the S/A 156, a terminal of the reading control circuit 158 connected to the first driving voltage VDD through another terminal may be connected to the first bit line BL1 and the reference voltage VRB may be connected to the first source line SL1. At this time, a resistance of the reading control circuit 158 changes based on the read driving signal RDF, and therefore, the control logic 120 illustrated in FIG. 1 may control the cell current IMT. For instance, the resistance of the reading control circuit 158 when the read driving signal RDF is enabled may be less than the resistance of the reading control circuit 158 when the read driving signal RDF is disabled. This approach will be described hereafter in some additional detail.

Figure 7C:
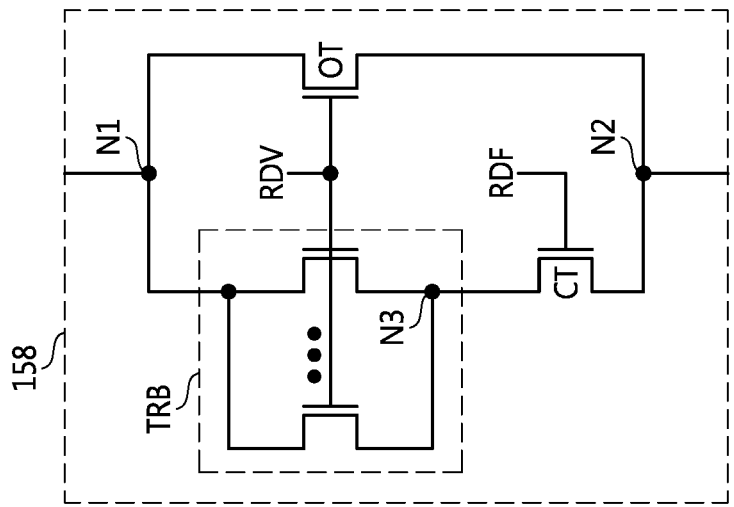
FIGS. 7A through 7C are circuit diagrams of a first writing control circuit, a second writing control circuit, and a reading control circuit according to some embodiments of the inventive concept.
Figure 7B:
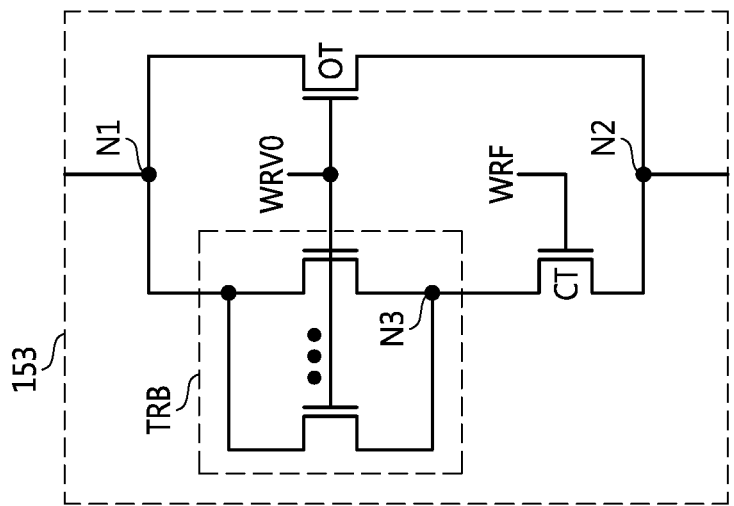
Figure 7A:
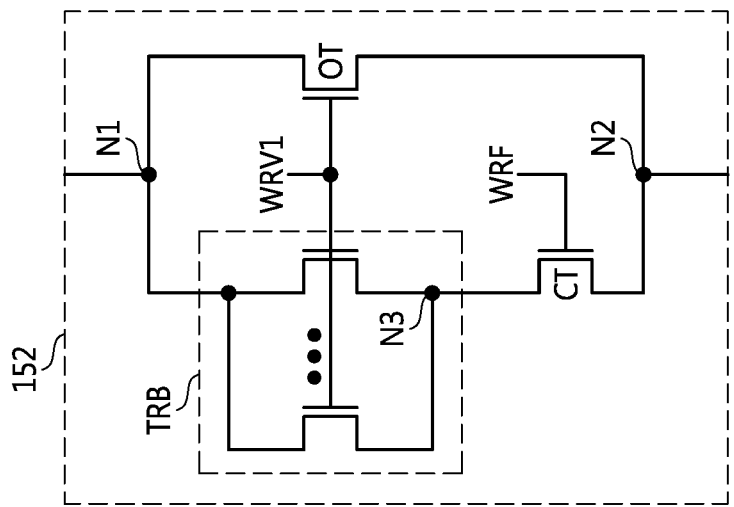

FIGS. 7A, 7B and 7C (collectively, "FIGS. 7A through 7C") are respective circuit diagrams further illustrating examples of the first writing control circuit 152, second writing control circuit 153, and reading control circuit 158 according to embodiments of the inventive concept. Referring to FIGS. 4, 6, and 7A through 7C, the writing control circuits 152 and 153 and the reading control circuit 158 each may include a plurality of transistors OT, TRB, and CT. The circuits 152, 153, and 158 have similar structures to one another. Thus, the first writing control circuit 152 will be representatively described and differences among them will be described. Each of the circuits 152, 153, and 158 may be implemented as a current mirror circuit.

Referring to FIG. 7A, the first writing control circuit 152 may include the control transistor CT connected between a second node N2 and a third node N3, the transistor block TRB connected between a first node N1 and the third node N3, and the ON-transistor OT connected between the first node N1 and the third node N3. Each of transistors illustrated in FIGS. 7A through 7C may be an NMOS transistor or a PMOS transistor. It is assumed below that each of the transistors is an NMOS transistor. However, the inventive concept is not restricted to this assumption.

The transistor block TRB may include "x" transistors connected in parallel, where "x" is an integer of at least 1. The first write operating voltage WRV1 may be applied to a gate of each of the "x" transistors included in the transistor block TRB and to a gate of the on-transistor OT. When the first write operating voltage WRV1 is enabled, the "x" transistors included in the transistor block TRB and the ON-transistor OT may be activated, i.e., turned ON. Contrarily, the write driving signal WRF may be applied to a gate of the control transistor CT. When the write driving signal WRF is enabled, the control transistor CT may be activated.

The resistance of the first writing control circuit 152 may be greater when the write driving signal WRF is disabled than when the write driving signal WRF is enabled. Accordingly, referring to FIGS. 4 and 7A through 7C, the resistance of the first writing control circuit 152 may be changed by controlling the output of the write driving signal WRF, which means that the magnitude of the cell current IMT may be changed. That is, a write driving period TFW may be changed by controlling the output timing of the write driving signal WRF and the magnitude of the cell current IMT may be determined by controlling the definition of the variable "x", i.e., the number of transistors included in the transistor block TRB. However, the inventive concept is not restricted to the current embodiments.

The operation of the first writing control circuit 152 may be applied to the second writing control circuit 153 and the reading control circuit 158 in the same manner.

Figure 9:
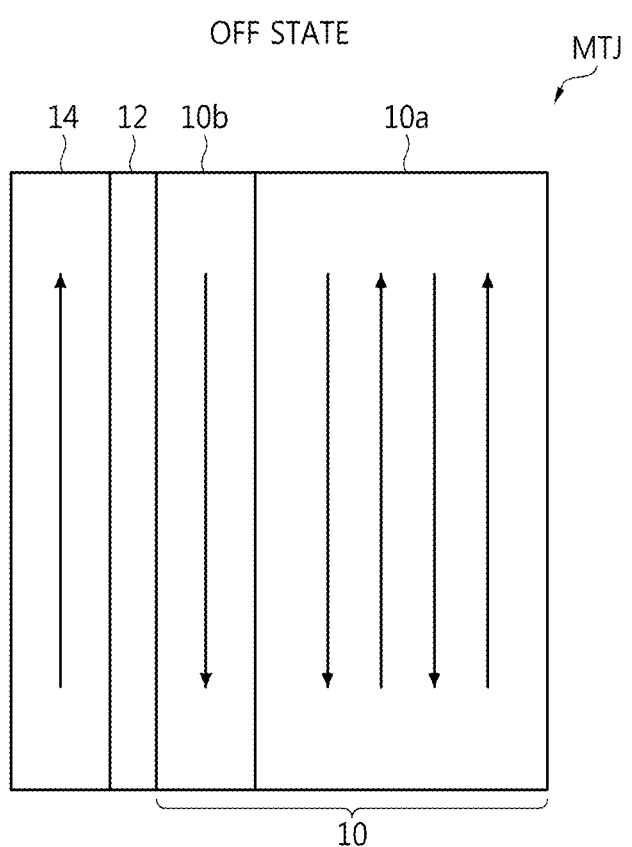

FIGS. 8 and 9 are respective block diagrams further illustrating an MTJ structure according to embodiments of the inventive concept. Referring to FIGS. 8 and 9, the MTJ structure is a stack of materials comprising; a fixed layer 10—including (e.g.,) a pinning layer 10a and a pinned layer 10b—a tunnel barrier layer 12, and a free layer 14.

In relation to the illustrated embodiments described in relation to FIGS. 4, 5, 6, 7, 8 and 9, when current is supplied to an MTJ structure in a memory cell MC, a magnetization reversal is induced in the free layer 14 within the MTJ structure, so that data is written. In other words, when switching current is supplied to the memory cell MC, data is written to the memory cell MC at an ON-state where the spin of the free layer 14 is the same as that of the pinned layer 10b as shown in FIG. 8 or at an OFF-state where the spin of the free layer 14 is opposite to that of the pinned layer 10b as shown in FIG. 9. When the memory cell MC is in the OFF-state, the MTJ structure has a high resistance. As described above, data is written to the memory cell MC when a switch current appropriate for magnetization reversal is applied to the memory cell MC.

Figure 10:
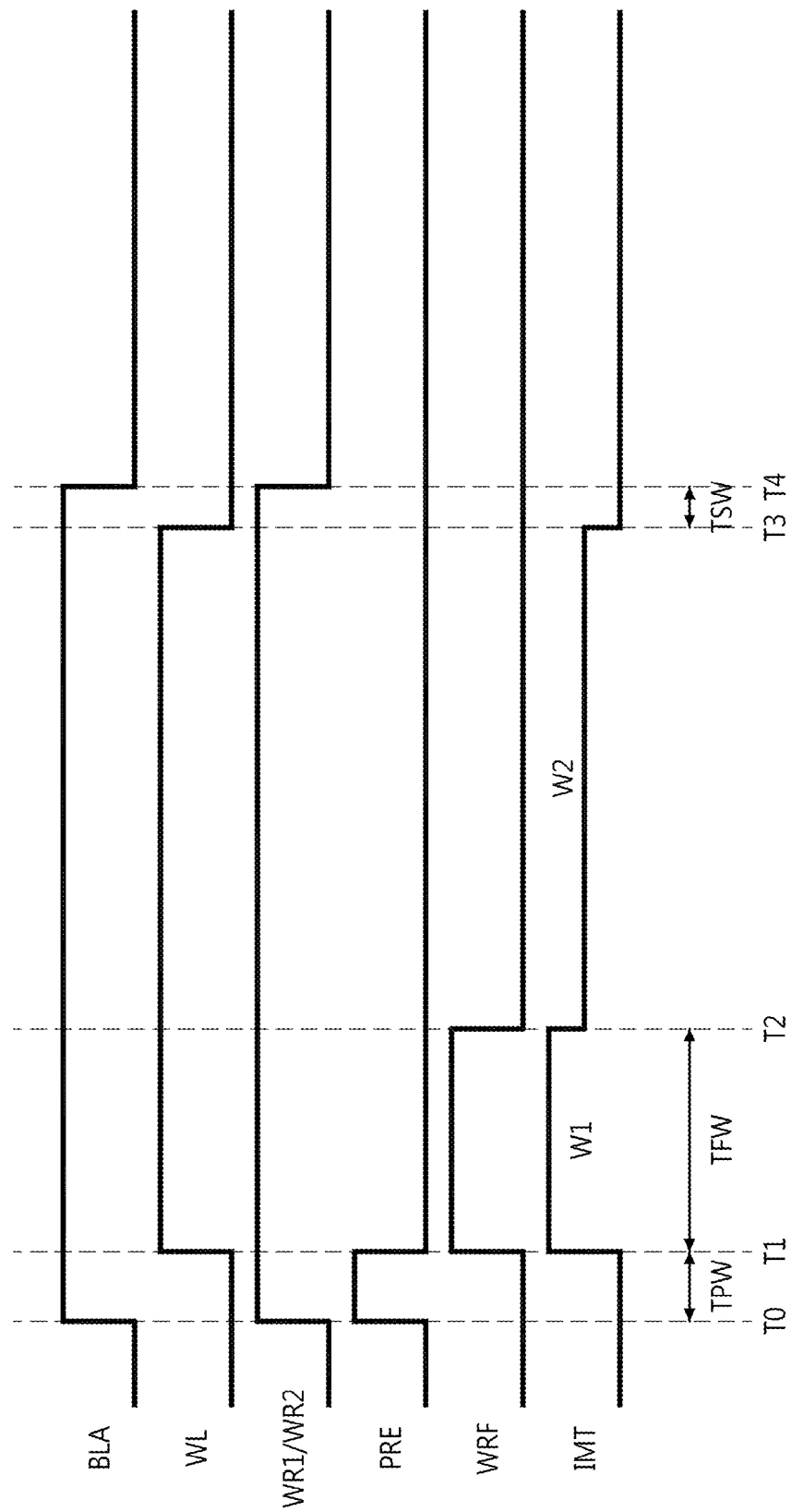
FIG. 10 is a timing chart showing a write operation of a semiconductor memory device according to some embodiments of the inventive concept.

FIG. 10 is a timing chart illustrating signal relationships associated with the execution of a write operation by a semiconductor memory device according to embodiments of the inventive concept. Referring to FIG. 10, the bit line control signal BLA is enabled at a time T0. As described above, when the bit line control signal BLA is enabled, a bit line and a source line may be activated by the bit line control circuit 155. The direction of the cell current IMT may be different depending on whether the write operation is a first write operation or a second write operation, but the direction of the cell current IMT is not considered below for convenience' sake in the description.

Either the first write control signal WR1 or second write control signal WR2 may be enabled at time T0. Accordingly, a plurality of switches included in the write driver 151 of FIG. 4 will be activated.

The precharge control signal PRE may also be enabled at time T0. Accordingly, the precharge circuit 154 illustrated in FIG. 5 will also be activated, and the bit line and the source line will be precharged to the reference voltage VRB by the precharge circuit 154. Here, the reference voltage VRB is assumed to be a precharge voltage for the write operation.

The precharge control signal PRE may be enabled during a write precharge period TPW of (e.g.,) from 1 to 2 ns. Between time T0 and time T1 in the illustrated example of FIG. 10, the cell current IMT does not flow.

The precharge control signal PRE may be disabled at time T1. A word line may be activated, and therefore, the cell current IMT begins to flow at time T1. The write driving signal WRF may be enabled at time T1. The write driving signal WRF may be enabled during a write driving period TFW of (e.g.,) 0 to 5 ns. The cell current IMT may have a first write current value W1 during a period between time T1 and time T2.

The write driving signal WRF may be disabled at time T2. Accordingly, the cell current IMT may be changed from the first write current value W1 to a second write current value W2, where the second write current value W2 may be less than the first write current value W1. The cell current IMT may have the second write current value W2 during a period between time T2 and time T3.

The word line may be deactivated at time T3, and therefore, the cell current IMT does not flow. The bit line control signal BLA and the first and second write control signals WR1 and WR2 may be disabled at time T4. A write setting time period TSW (the period between times T3 and T4) may be set to prevent an abnormal operation during the write operation of the semiconductor memory device 100.

Figure 11:
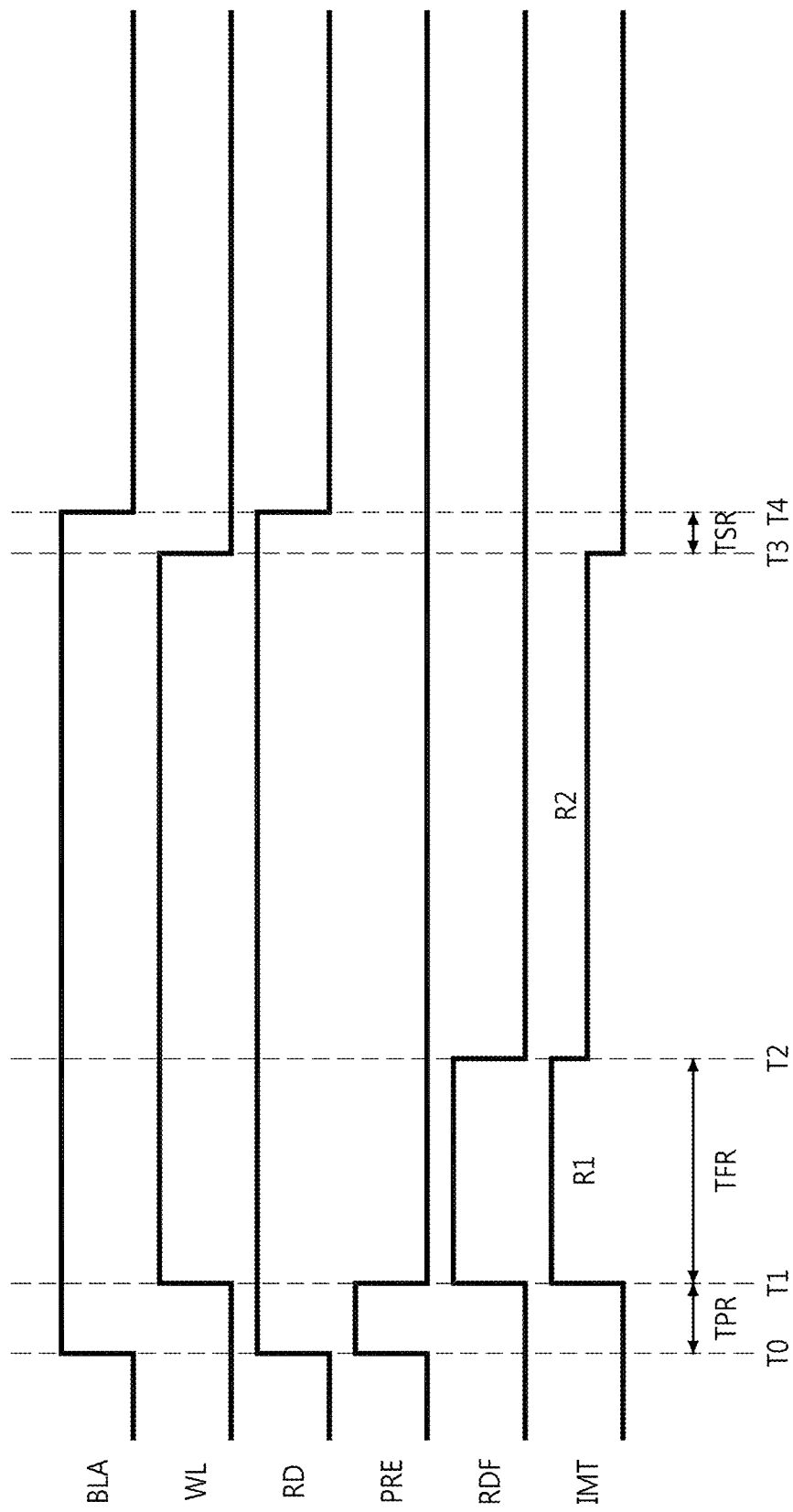
FIG. 11 is a timing chart showing a read operation of a semiconductor memory device according to some embodiments of the inventive concept.

FIG. 11 is a timing chart illustrating signal relationships associated with the execution of a read operation by a semiconductor memory device according to embodiments of the inventive concept. Referring to FIG. 11, the bit line control signal BLA may be enabled at time T0. As described above, when the bit line control signal BLA is enabled, a bit line and a source line may be activated by the bit line control circuit 155.

The read control signal RD may be enabled at time T0. Accordingly, a plurality of switches included in the S/A 156 illustrated in FIG. 6 will be activated. The precharge control signal PRE may be enabled at time T0. Accordingly, the precharge circuit 154 illustrated in FIG. 5 may be activated and the bit line and the source line may be precharged to the reference voltage VRB by the precharge circuit 154. Here, the reference voltage VRB is assumed to be a precharge voltage for the read operation. The precharge control signal PRE may be enabled during a read precharge period TPR of (e.g.,) 1 to 2 ns. During the period between times T0 and T1, the cell current IMT does not flow.

The precharge control signal PRE may be disabled at time T1. A word line may be activated, and therefore, the cell current IMT begins to flow at time T1. The read driving signal RDF may be enabled at time T1. The read driving signal RDF may be enabled during a read driving period TFR of (e.g.,) 0 to 5 ns. The cell current IMT may have a first read current value R1 during the period between times T1 and T2.

The read driving signal RDF may be disabled at time T2. Accordingly, the cell current IMT may be changed from the first read current value R1 to a second read current value R2, where the second read current value R2 may be less than the first read current value R1. The cell current IMT may have the second read current value R2 during the period between times T2 and T3.

The word line may be deactivated at time T3, and therefore, the cell current IMT does not flow. The bit line control signal BLA and the read control signal RD may be disabled at time T4. A read setting time period (e.g., the period between times T3 and T4) may be set to prevent an abnormal operation during the read operation of the semiconductor memory device 100.

Figure 12:
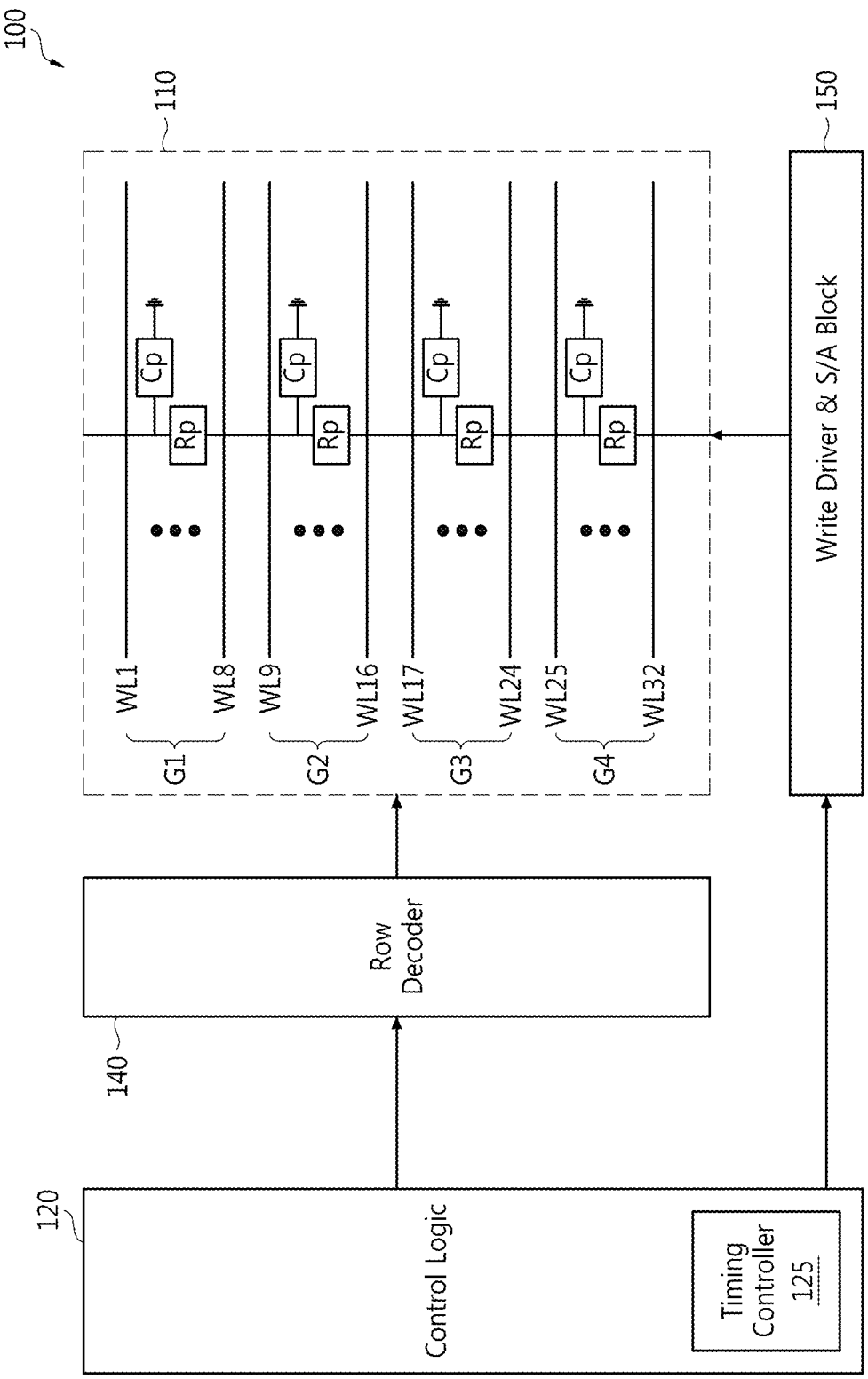
FIG. 12 is a block diagram of an operation of a semiconductor memory device according to some embodiments of the inventive concept.
Figures 13, 14:
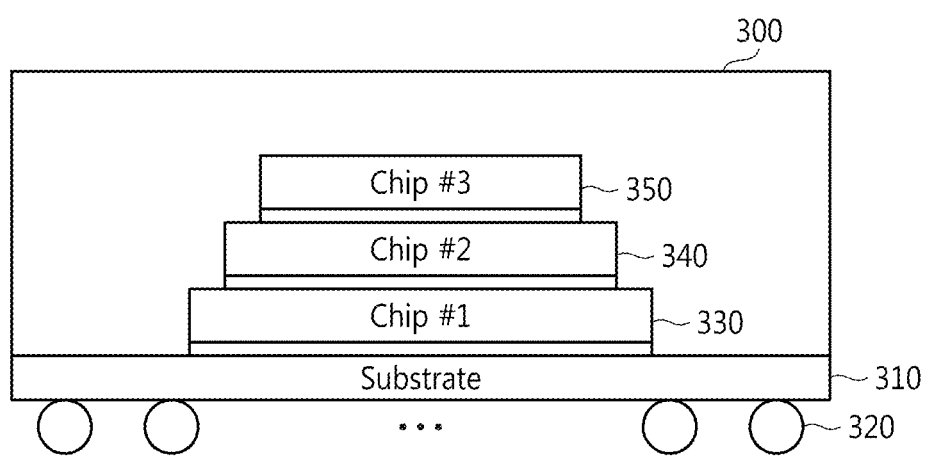
FIG. 13 is a table showing the calculation results of a timing controller illustrated in FIG. 12.
FIG. 14 is a conceptual diagram of a package including a semiconductor memory device according to some embodiments of the inventive concept.

FIG. 12 is a block diagram further illustrating operation of the semiconductor memory device 100 according to some embodiments of the inventive concept. FIG. 13 is a table listing calculation results generated by the timing controller 125 of FIG. 12. In the context of the previously described embodiments, only the memory cell array 110, control logic 120, row decoder 140, and write driver and S/A block 150 are illustrated in FIG. 12 for convenience of description.

Referring to FIGS. 12 and 13, the memory cell array 110 is assumed for purposes of illustration to include 32 word lines (i.e., 'm'=32 for word lines WL1 through WLm), where the first through eighth word lines WL1 through WL8 are grouped into a first group G1; the ninth through 16th word lines WL9 through WL16 are grouped into a second group G2; the 17th through 24th word lines WL17 through WL24 are grouped into a third group G3; and the 25th through 32nd word lines WL25 through WL32 are grouped into a fourth group G4. Here, the eight word line grouping approach is just one example of many other approaches that may be used in other embodiments of the inventive concept.

The distance between a memory cell MC and the write driver and S/A block 150 increases as a group including the memory cell MC shifts from the fourth group G4 toward the first group G1. Accordingly, even though one driving voltage or control signal is applied to the first group G1 and the fourth group G4, the waveform of the driving voltage associated with the control signal changes (e.g.,) in accordance with an RC delay as the result of parasitic resistance Rp and parasitic capacitance Cp in the memory cell array 110. As a result, an operating speed may decrease and in extreme examples abnormal operation may occur. For instance, one or more data errors may arise during the execution of a write or read operation performed on the most distant, first group G1.

The control logic 120 of FIG. 12 includes the timing controller 125, and is again assumed to generate a plurality of the control signals (e.g.,) WRF, WR1, WR2, PRE, RDF, and RD under the control of the timing controller 125.

In order to increase the operating speed and prevent an abnormal operation of the semiconductor memory device 100, the timing controller 125 may control the output timing of the control signals. For example, the timing controller 125 may set the write driving period TFW and/or read driving period TFR taking into account the parasitic resistance Rp and the parasitic capacitance Cp of the memory cell array 110. Accordingly, the same control signal will be effectively applied to each of the respective first through fourth groups G1 through G4 and the operating speed of the semiconductor memory device 100 may be increased accordingly.

For instance, the timing controller 125 may control the output timing of the write driving signal WRF, first and second write control signals WR1 and WR2, precharge control signal PRE, read driving signal RDF, and read control signal RD, such that the control signals WRF, WR1, WR2, PRE, RDF, and RD are output as shown in FIGS. 10 and 11. In other words, the timing controller 125 may set the write precharge period TPW, write driving period TFW, and write setting period TSW associated with a write operation, and may further set the read precharge period TPR, read driving period TFR, and read setting period TSR associated with a read operation.

FIG. 13 is a table listing certain approaches to the calculation (or determination) of the write driving period TFW and read driving period TFR by the timing controller 125 in order to maximize the memory cell array operating speed. Although the write driving period TFW has the same value as the read driving period TFR in the embodiments illustrated in FIG. 13, the inventive concept is not restricted to the current embodiments.

Referring to FIGS. 10, 11, 12 and 13, the parasitic resistance Rp and parasitic capacitance Cp of the memory cell array 110 tends to increase in the direction from the write driver and S/A block 150 towards the first group G1. Accordingly, the write driving period TFW and read driving period TFR corresponding to the first group G1 may have the greater value than the write driving period TFW and read driving period TFR corresponding to the fourth group G4. Hence, the write driving period TFW and read driving period TFR for each of the groups G1 through G4 may linearly increase or decrease according to its relative group position, but the inventive concept is not restricted to the current embodiments.

As listed in FIG. 13, the write driving period TFW corresponding to the fourth group G4 may be TD1, where TD1 is a predetermined value. The write driving period TFW corresponding to the third group G3 may be TD1+TD2, where TD2 is a function of the parasitic resistance Rp and parasitic capacitance Cp. The write driving period TFW corresponding to the second group G2 may be TD1+2*TD2. The write driving period TFW corresponding to the first group G1 may be TD1+3*TD2. The read driving period TFR may be similarly defined. Although the read driving period TFR and write driving period TFW are determined on a group-by-group basis for the embodiment illustrated in FIG. 13, the inventive concept is not so restricted. In other embodiments, the read driving period TFR and write driving period TFW may be calculated on a word line basis.

FIG. 14 is a conceptual diagram illustrating a package 300 including the semiconductor memory device 100 of FIG. 1 according to embodiments of the inventive concept. Referring to the foregoing embodiments, the package 300 may include a plurality of semiconductor devices 330, 340, and 350 which are sequentially stacked on a package substrate 310. Each of the semiconductor devices 330 through 350 may be the semiconductor memory device 100. The package 300 may be implemented as a package on package (PoP), a ball grid array (BGA), a chip scale package (CSP), a plastic leaded chip carrier (PLCC), a plastic dual in-line package (PDIP), a die in wafer form, a chip on board (COB), a ceramic dual in-line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi chip package (MCP), a wafer-level package (WLP), or a wafer-level processed stack package (WSP).

A memory controller (not shown) may be implemented within at least one of the semiconductor devices 330 through 350 or may be implemented on the package substrate 310. An electrical vertical connection means, e.g., a through-silicon via (TSV), may be used to electrically connect the semiconductor devices 330 through 350 with one another.

The package 300 may be implemented as a hybrid memory cube (HMC) having a structure in which the memory controller and a memory cell array die are stacked. When the package 300 is implemented as the HMC, the performance of the semiconductor memory device 100 increases due to the increase of a bandwidth and an area occupied by the semiconductor memory device 100 is minimized. As a result, power consumption and manufacturing cost are reduced.

Figure 15:
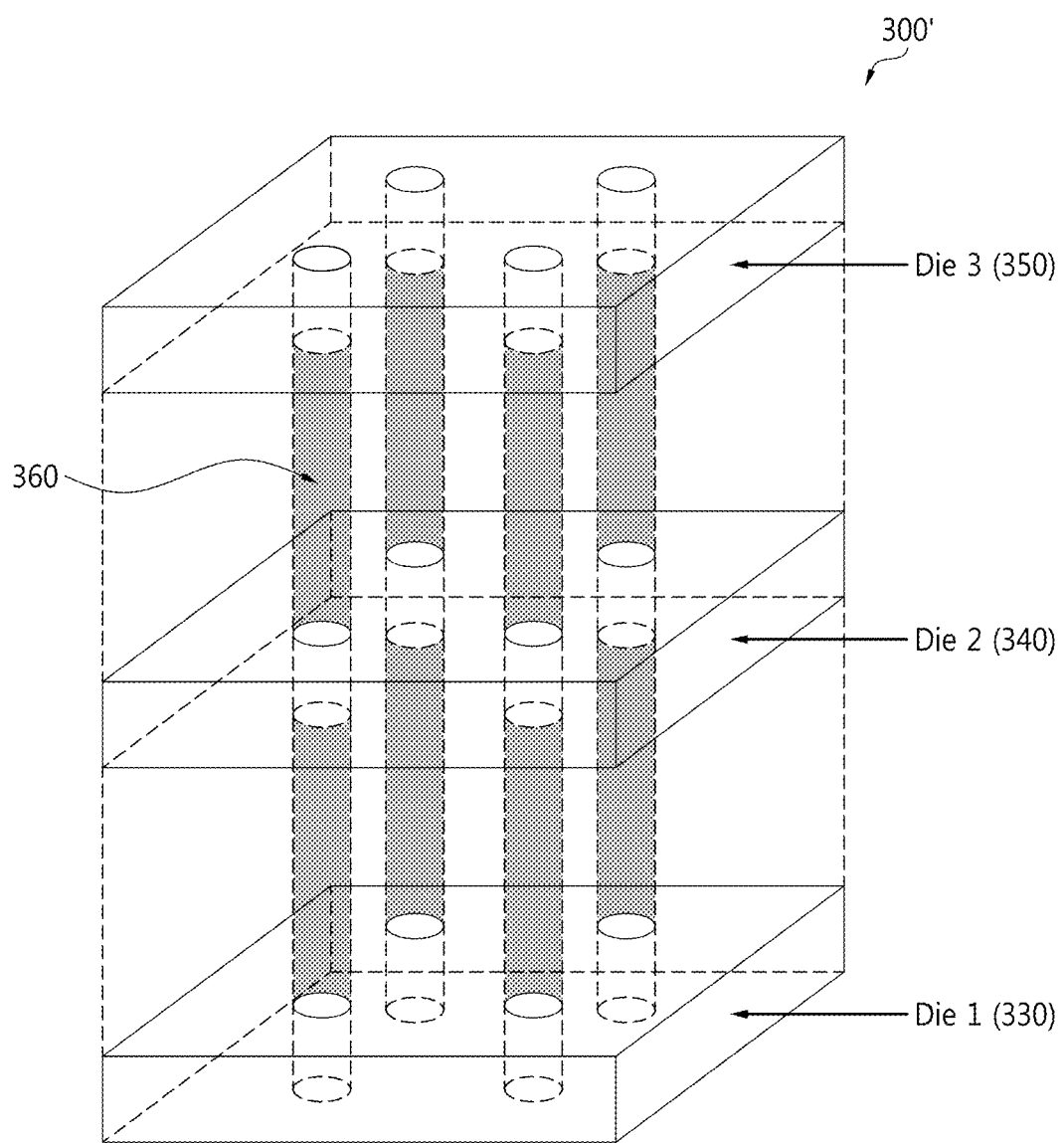
FIG. 15 is a three-dimensional conceptual diagram of a package including a semiconductor memory device according to some embodiments of the inventive concept.

FIG. 15 is another conceptual diagram illustrating a three-dimensional version of a package 300' including the semiconductor memory device 100 of FIG. 1 according to some embodiments of the inventive concept. Referring to FIGS. 1, 14, and 15, the package 300' includes a plurality of dies 330 through 350 connected through a through via TSV 360 with one another in a stack structure.

Figure 16:
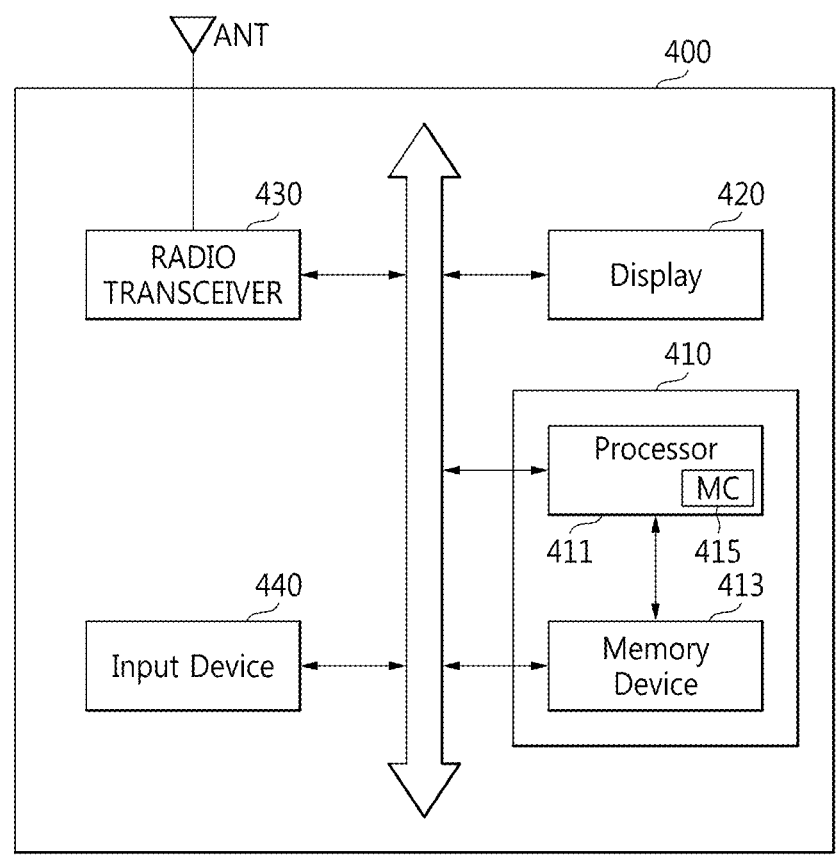
FIG. 16 is a block diagram of a system including a semiconductor memory device according to some embodiments of the inventive concept.

FIG. 16 is a diagram of a system 400 including the semiconductor memory device illustrated in FIG. 1 according to some embodiments of the inventive concept. Referring to FIGS. 1, and 14 through 16, the system 400 may be implemented as an electronic device or a portable device. The portable device may be implemented as a cellular phone, a smart phone, or a tablet PC.

The system 400 includes a processor 411 and a semiconductor memory device 413. The semiconductor memory device 413 may be the semiconductor memory device 100 illustrated in FIG. 1. The processor 411 and the semiconductor memory device 413 may be packaged in a package 410. In this case, the package 410 may be mounted on a system board (not shown). The package 410 may be the package 300 shown in FIG. 14 or the package 300' shown in FIG. 15.

The processor 411 may include a memory controller 415 controlling a data access operation, e.g., a write operation or a read operation, of the semiconductor memory device 413. The memory controller 415 is controlled by the processor 411 that controls the overall operation of the system 400. The memory controller 415 may be connected between the processor 411 and the semiconductor memory device 413.

Data of the semiconductor memory device 413 may be displayed through a display 420 according to the control of the processor 411. A radio transceiver 430 may transmit or receive radio signals through an antenna ANT. The radio transceiver 430 may convert radio signals received through the antenna ANT into signals that can be processed by the processor 411. Accordingly, the processor 411 may process the signals output from the radio transceiver 430 and store the processed signals into the semiconductor memory device 413 or display the processed signals through the display 420. The radio transceiver 430 may also convert signals output from the processor 411 into radio signals and output the radio signals to an external device through the antenna ANT.

An input device 440 enables control signals for controlling the operation of the processor 411 or data to be processed by the processor 411 to be input to the semiconductor memory device 413. The input device 440 may be implemented as a pointing device such as a touch pad or a computer mouse, a keypad, or a keyboard.

The processor 411 may control the operation of the display 420 to display data output from the memory controller 420, data output from the radio transceiver 430, or data output from the input device 440.

Figure 17:
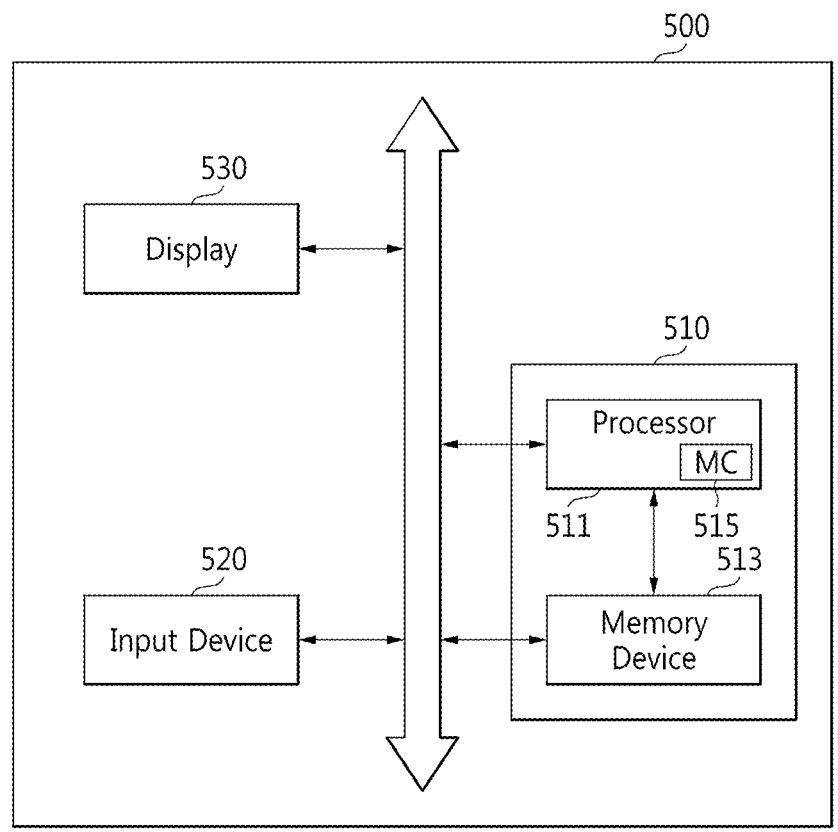
FIG. 17 is a block diagram of a system including a semiconductor memory device according to some embodiments of the inventive concept.

FIG. 17 is a block diagram of a system 500 including the semiconductor memory device illustrated in FIG. 1 according to some embodiments of the inventive concept.

Referring to FIGS. 1, and 14, 15 and 17, the system 500 may be implemented as a personal computer (PC), a tablet PC, a net-book, an e-reader, a personal digital assistant (PDA), a portable multimedia player (PMP), an MP3 player, or an MP4 player.

The system 500 includes a processor 511 controlling the overall operation of the system 500, and the semiconductor memory device 513. The semiconductor memory device 513 may be the semiconductor memory device 100 illustrated in FIG. 1.

The processor 511 and the semiconductor memory device 513 may be packaged in a package 510. In this case, the package 510 may be mounted on a system board (not shown). The package 510 may be the package 300 shown in FIG. 14 or the package 300' shown in FIG. 15.

The processor 511 may include a memory controller 515 for controlling the operation of the semiconductor memory device 513.

The processor 511 may display data stored in the semiconductor memory device 513 through the display 530 according to data input through the input device 520. The input device 520 may be implemented by a pointing device such as a touch pad or a computer mouse, a keypad, or a keyboard.

Figure 18:
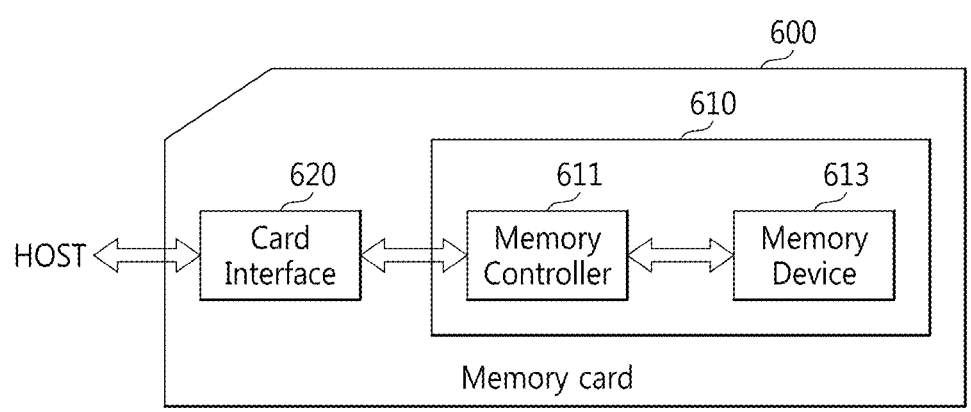
FIG. 18 is a block diagram of a system including a semiconductor memory device according to some embodiments of the inventive concept.

FIG. 18 is a block diagram of a system 600 including the semiconductor memory device illustrated in FIG. 1 according to some embodiments of the inventive concept. Referring to FIGS. 1, and 14, 15 and 18, the system 600 may be implemented as a memory card or a smart card.

The system 600 includes the semiconductor memory device 613, a memory controller 611, and a card interface 610. The semiconductor memory device 613 may be the semiconductor memory device 100 illustrated in FIG. 1.

The processor 611 and the semiconductor memory device 613 may be packaged in a package 610. In this case, the package 610 may be mounted on a system board (not shown). The package 610 may be the package 300 shown in FIG. 14 or the package 300' shown in FIG. 15.

The memory controller 611 may control data exchange between the semiconductor memory device 613 and the card interface 610.

According to some embodiments, the card interface 610 may be a secure digital (SD) card interface or a multi-media card (MMC) interface, but the inventive concept is not restricted to the current embodiments.

The card interface 610 may interface a host and the memory controller 611 for data exchange according to a protocol of the host.

When the system 600 is connected with the host such as a PC, a tablet PC, a digital camera, a digital audio player, a cellular phone, a console video game hardware, or a digital set-top box, the host may perform data communication with the semiconductor memory device 613 through the card interface 610 and the memory controller 611.

Figure 19:
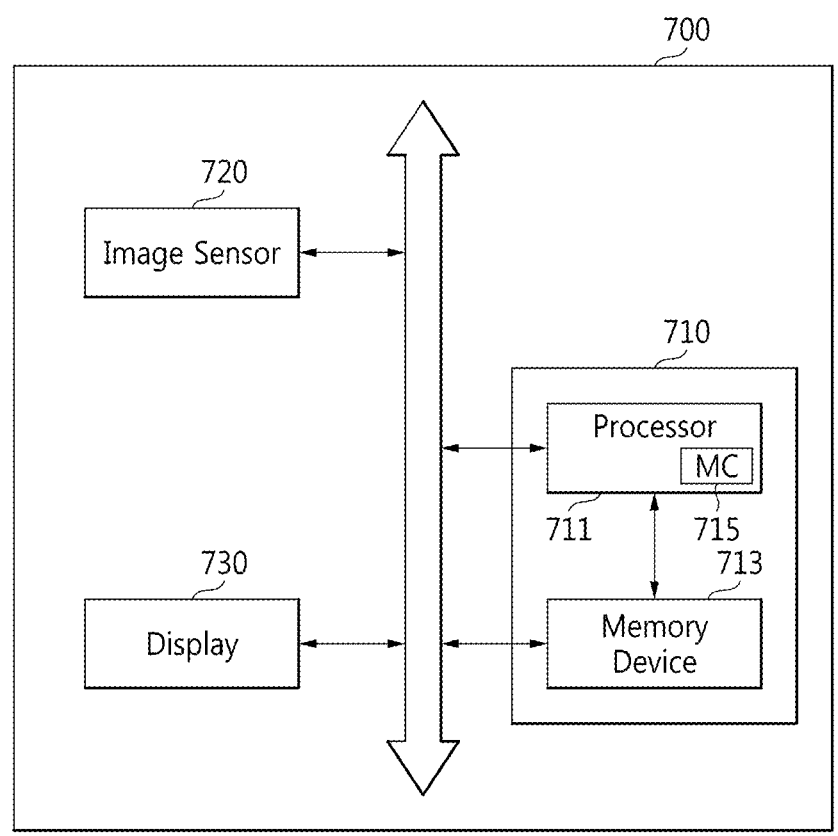
FIG. 19 is a block diagram of a system including a semiconductor memory device according to some embodiments of the inventive concept.

FIG. 19 is a block diagram of a system 700 including the semiconductor memory device illustrated in FIG. 1 according to some embodiments of the inventive concept. Referring to FIGS. 1, 14, 15 and 19, the system 700 may be implemented as a digital camera, or a portable device equipped with a digital camera.

The system 700 includes a processor 711 controlling the overall operation of the system 700, and the semiconductor memory device 713. The semiconductor memory device 713 may be the semiconductor memory device 100 illustrated in FIG. 1.

The processor 711 and the semiconductor memory device 713 may be packaged in a package 710. In this case, the package 710 may be mounted on a system board (not shown). The package 710 may be the package 300 shown in FIG. 14 or the package 300' shown in FIG. 15.

The image sensor 720 included in the system 700 converts optical images into digital signals. The digital signals may be controlled by the processor 711 to be displayed through the display 730 or stored in the semiconductor memory device 713. Data stored in the semiconductor memory device 713 may be displayed through the display 730 according to the control of the processor 711.

Figure 20:
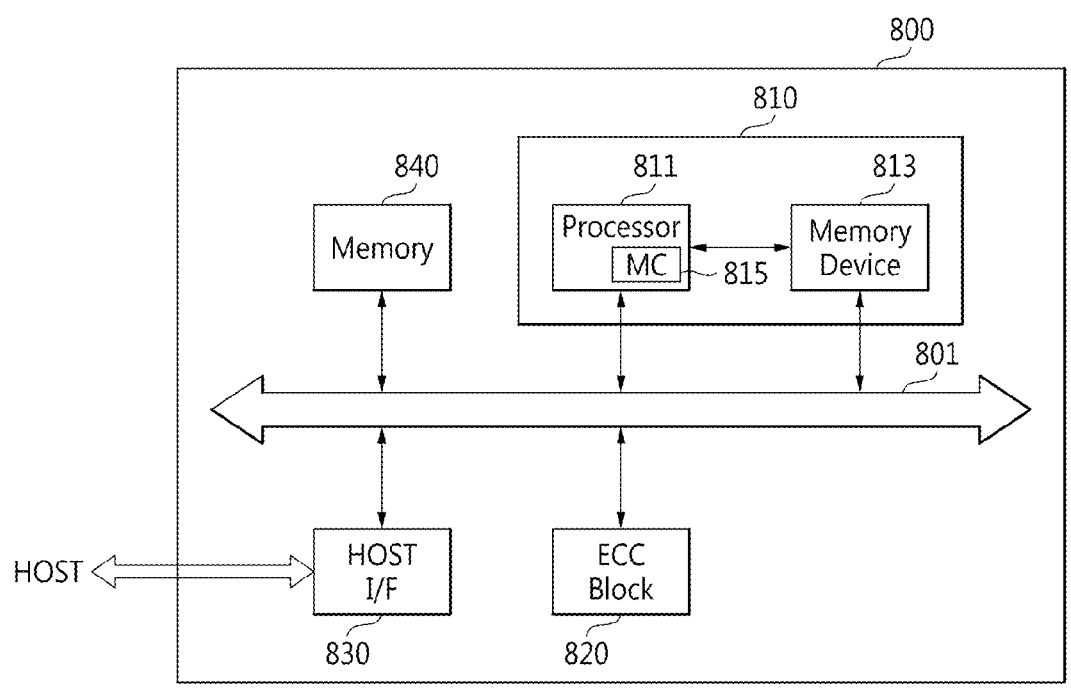
FIG. 20 is a block diagram of a system including a semiconductor memory device according to some embodiments of the inventive concept.

FIG. 20 is a block diagram of a system 800 including the semiconductor memory device illustrated in FIG. 1 according to some embodiments of the inventive concept. Referring to FIGS. 1, 14, 15 and 20, the system 800 includes a semiconductor memory device 813 and a processor 811 controlling the overall operation of the system 700. The semiconductor memory device 813 may be the semiconductor memory device 100 illustrated in FIG. 1.

The processor 811 and the semiconductor memory device 813 may be packaged in a package 810. In this case, the package 810 may be mounted on a system board (not shown). The package 810 may be the package 300 shown in FIG. 14 or the package 300' shown in FIG. 15.

The processor 811 includes a memory controller 815 for controlling the operations of the semiconductor memory device 813. The system 800 includes a memory 840 which may be used as an operation memory of the processor 811. The memory 840 may be implemented by a non-volatile memory such as a ROM (read only memory) or a flash memory.

The host connected with the system 800 may perform data communication with the semiconductor memory device 813 through the processor 811 and a host interface 830.

At this time, the memory controller 815 may perform the function of the memory interface. The system 800 may further include ECC (error correction code) block 820.

The ECC block 820 is controlled by the processor 811 to detect an error bit included in data output from the semiconductor memory device 813 through the memory controller 815, correct the error bit. The processor 811 may control data communication among the ECC block 820, the host interface 830, and the memory 840 through a bus 801.

The system 700 may be implemented as a USB memory drive or a memory stick.

Figure 21:
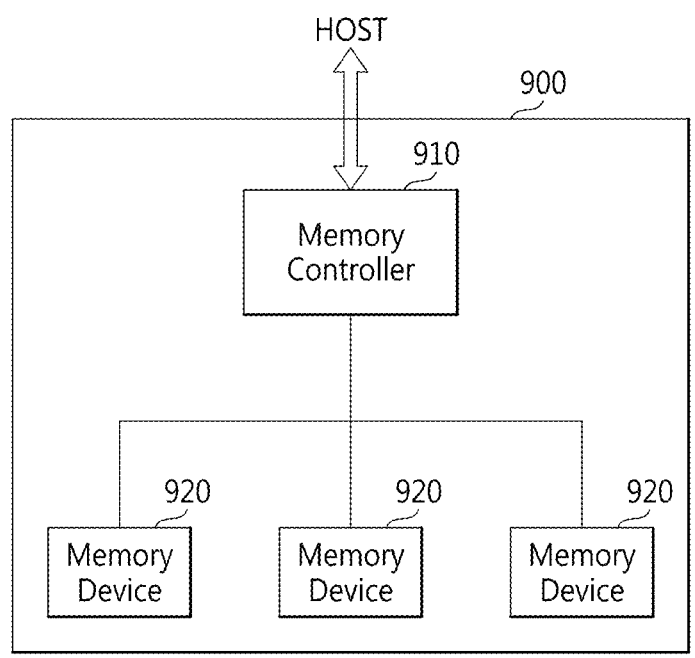
FIG. 21 is a block diagram of a system including a semiconductor memory device according to some embodiments of the inventive concept.

FIG. 21 is a block diagram of a system 900 including the semiconductor memory device illustrated in FIG. 1 according to some embodiments of the inventive concept. Referring to FIGS. 1, 14, 15 and 21, the system 900 may be implemented as a data storage device. The system 900 may include a plurality of semiconductor memory devices 920, and a memory controller 910 which may control the data processing operations of each memory device. The system 900 may be implemented in memory modules.

Each of the plurality of semiconductor memory devices 920 may refer to the semiconductor memory device 100 shown in FIG. 1.

Figure 22:
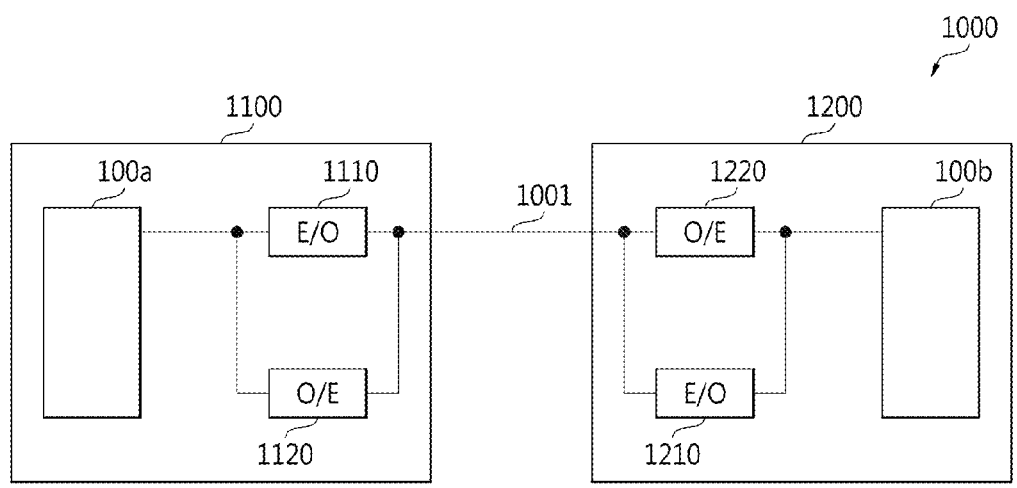
FIG. 22 is a block diagram of a system including a semiconductor memory device according to some embodiments of the inventive concept.

FIG. 22 is a block diagram of a system 1000 including the semiconductor memory device according to some embodiments of the inventive concept. Referring to FIG. 22, the system 1000 may include a first system 1100 and a second system 1200 which communicate data with each other through a channel 1001. The channel 1001 may be an optical connection means. The optical connection means may be an optical fiber, an optical waveguide, or a medium that transmits an optical signal.

The first system 1100 may include a first semiconductor memory device 100a and an electro-optic (E/O) conversion circuit 1110. The E/O conversion circuit 1110 may convert an electrical signal output from the first semiconductor memory device 100a into an optical signal and output the optical signal to the second system 1200 through the optical connection means 1001.

The second system 1200 may include an opto-electric (O/E) conversion circuit 1220 and a second semiconductor memory device 100b. The O/E conversion circuit 1220 may convert an optical signal input through the optical connection means 1001 into an electrical signal and transmit the electrical signal to the second semiconductor memory device 100b.

The first system 1100 may also include an O/E conversion circuit 1120 and the second system 1200 may also include an E/O conversion circuit 1210. When the second system 1200 transmit data to the first system 1100, the E/O conversion circuit 1210 may convert an electrical signal output from the second semiconductor memory device 100b into an optical signal and output the optical signal to the first system 1100 through the optical connection means 1001. The O/E conversion circuit 1120 may convert the optical signal received through the optical connection means 1001 into an electrical signal and transmit the electrical signal to the first semiconductor memory device 100a. The structure and the operations of the semiconductor memory devices 100a and 100b are substantially the same as those of the semiconductor memory device 100 illustrated in FIG. 1.

As described above, according to some embodiments of the inventive concept, a semiconductor memory device changes a current flowing in memory cells according to the position of each of the memory cells, thereby increasing an operating speed.

While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A semiconductor memory device comprising:
a memory cell array comprising a plurality of memory cells, wherein each of the memory cells is addressed by a word line among a plurality of word lines grouped into a plurality of word line groups, a bit line among a plurality of bit lines, and a sense lines among a plurality of sense lines; and a peripheral circuit configured to supply cell current to memory cells, among the plurality of memory cells, addressed by a selected word line, among the plurality of word lines, during a read operation or a write operation, wherein the peripheral circuit varies the cell current supplied to the memory cells addressed by the selected word line according to a position of a word line group, among the word line groups, to which the selected word line belongs, wherein:

the peripheral circuit comprises:

control logic that generates control signals including a write driving signal, and a write driver that generates the cell current in response to the control signals, wherein the write driver comprises a first writing control circuit and a second writing control circuit that vary the cell current in response to the write driving signal such that during the write operation, in which the memory cells addressed by the selected word line are programmed by non-zero first and second write current values of the cell current, the cell current has the first write current value when the write driving signal is enabled and has the second write current value, which is lesser than the first write current value, when the write driving signal is disabled.

2. The semiconductor memory device of claim 1, wherein the control signals include a read driving signal.

3. The semiconductor memory device of claim 2, wherein the peripheral circuit comprises a sense amplifier configured to vary the cell current in response to a read control signal and the read driving signal during the read operation.

4. The semiconductor memory device of claim 3, wherein:

the control logic comprises; a timing controller configured to define a read driving period and a write driving period, during the read driving period time the cell current has a non-zero first read current value greater than a non-zero second read current value, and during the write driving period the cell current has the first write current value greater than the second write current value, and the control logic generates the write driving signal and read driving signal based on the write driving period and the read driving period, respectively.

5. The semiconductor memory device of claim 4, wherein the sense amplifier comprises:

a sense amplification circuit configured to sense the cell current and output corresponding read data; and a reading control circuit configured to control the cell current in response to the read driving signal such that during the read operation, in which the memory cells addressed by the selected word line are read by the first and second read current values of the cell current, the cell current has the first read current value when the read driving signal is enabled and has the second read current value when the read driving signal is disabled.

6. The semiconductor memory device of claim 3, wherein the write driver and sense amplifier constitute a write driver and sense amplifier block that comprises:

a precharge circuit configured to precharge the plurality of bit lines and the plurality of sense lines in response to a precharge control signal; and a bit line control circuit configured to selectively activate a first bit line among the plurality of bit lines and a first sense line among the plurality of sense lines in response to a bit line control signal generated by the control logic.

7. The semiconductor memory device of claim 1, wherein:

each of the first and second writing control circuits comprises:

an ON-transistor connected between a first node and a second node;

a transistor block connected between the first node and a third node; and a control transistor connected between the second node and the third node, and the transistor block comprises "x" transistors, where "x" is an integer greater than 0, and the first write current value is determined according to a value of "x".

8. The semiconductor memory device of claim 7, wherein the control transistor is a P-channel metal oxide semiconductor (PMOS) transistor.

9. The semiconductor memory device of claim 1, wherein the memory cells are STT-MRAM cells.

10. A semiconductor memory device comprising:

a memory cell array comprising a plurality of memory cells connected to a plurality of word lines arranged in a first direction, a plurality of bit lines arranged in a second direction, and a plurality of sense lines arranged in the second direction;

a control logic configured to generate control signals including a write driving signal and a read driving signal; and a write driver and sense amplifier block configured to generate a cell current that varies in response to the control signals and is selectively applied to memory cells, among the plurality of memory cells, that are addressed by a selected word line, among the plurality of word lines, during a write operation or a read operation, wherein:

the control logic comprises a timing controller configured to define a write driving period, the write driver and sense amplifier block comprises a first writing control circuit and a second writing control circuit that vary the cell current in response to the write driving signal such that during the write operation, in which the memory cells addressed by the selected word line are programmed by non-zero first and second write current values of the cell current, the cell current has the first write current value when the write driving signal is enabled and has the second write current value, which is lesser than the first write current value, when the write driving signal is disabled.

11. The semiconductor memory device of claim 10, wherein:

each of the first and second writing control circuits comprises:

a control transistor;

a transistor block connected in series with the control transistor; and an ON-transistor connected in parallel with the transistor block, wherein the transistor block comprises "x" transistors, where "x" is an integer of at least 1, and the first write current value is determined according to a value of "x".

12. The semiconductor memory device of claim 10, wherein the write driver and sense amplifier block comprises:

a sense amplification circuit configured to sense the cell current and output corresponding read data; and a reading control circuit configured to control the cell current in response to the read driving signal, wherein the reading control circuit comprises:
an ON-transistor connected between a first node and a second node;
a transistor block connected between the first node and a third node; and
a control transistor connected between the second node and the third node, wherein a first read current value is determined according to a number of transistors in the transistor block.

13. The semiconductor memory device of claim 10, wherein:
the timing controller further defines a read driving period, during the read driving period the cell current has a non-zero first read current value greater than a non-zero second read current value, and
the control logic respectively generates the write driving signal and the read driving signal in response to the write driving period and the read driving period.

14. The semiconductor memory device of claim 10, wherein the memory cells are spin torque transfer-magnetic random access memory (STT-MRAM) cells.

15. A semiconductor memory device comprising:
a memory cell array comprising a plurality of memory cells, wherein each memory cell is a spin torque transfer-magnetic random access memory (STT-MRAM) cell addressed by a word line among a plurality of word lines, and connected between a bit line among a plurality of bit lines and a sense line among a plurality of sense lines, wherein the memory cell array is divided into a first memory cell array and a second memory cell array; and
peripheral circuitry configured to supply cell current to the plurality of memory cells during a read operation or a write operation, such that the cell current supplied to memory cells, among the plurality of memory cells, addressed by a selected word line, among the plurality of word lines, varies according to a position of a word line group including the selected word line, wherein at least a portion of the peripheral circuitry is disposed between the first memory cell array and second memory cell array,
the peripheral circuitry comprises:
control logic that generates first control signals including a write driving signal, wherein the control logic comprises a timing controller configured to define a write driving period, and
a write driver that generates the cell current in response to the first control signals, wherein the write driver comprises a first writing control circuit and a second writing control circuit that vary the cell current in response to the write driving signal such that during the write operation, in which the memory cells addressed by the selected word line are programmed by non-zero first and second write current values of the cell current, the cell current has the first write current value when the write driving signal is enabled and has the second write current value, which is lesser than the first write current value, when the write driving signal is disabled.

16. The semiconductor memory device of claim 15, wherein:
the peripheral circuitry comprises a row decoder providing second control signals to the plurality of word lines; and
the control logic further generates a read driving signal.

17. The semiconductor memory device of claim 16, wherein:
the first control signals comprise a first write control signal and a second write control signal; and
the peripheral circuitry further comprises a sense amplifier configured to vary the cell current in response to a read control signal and the read driving signal during the read operation.

18. The semiconductor memory device of claim 17, wherein:
the timing controller further defines a read driving period, and
during the read driving period the cell current has a non-zero first read current value greater than a non-zero second read current value.

19. The semiconductor memory device of claim 13, wherein:
wherein the write driver and sense amplifier block comprises a reading control circuit configured to control the cell current in response to the read driving signal, and
the reading control circuit controls the cell current in response to the read driving signal such that during the read operation, in which the memory cells addressed by the selected word line are read with the first and second read current values of the cell current, the cell current has the first read current value when the read driving signal is enabled and has the second read current value when the read driving signal is disabled.

20. The semiconductor memory device of claim 18, wherein the sense amplifier comprises a reading control circuit that controls the cell current in response to the read driving signal such that during the read operation, in which the memory cells addressed by the selected word line are read with the first and second read current values of the cell current, the cell current has the first read current value when the read driving signal is enabled and has the second read current value when the read driving signal is disabled.

* * * * *